(12) United States Patent
Yatsunami et al.

(10) Patent No.: US 7,372,070 B2
(45) Date of Patent: May 13, 2008

(54) ORGANIC FIELD EFFECT TRANSISTOR AND METHOD OF MANUFACTURING THE SAME

(75) Inventors: Ryuichi Yatsunami, Fukuoka (JP); Kei Sakanoue, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/127,178

(22) Filed: May 12, 2005

(65) Prior Publication Data

US 2005/0263756 A1 Dec. 1, 2005

(30) Foreign Application Priority Data

May 12, 2004 (JP) ............................. 2004-142320
May 12, 2004 (JP) ............................. 2004-142353

(51) Int. Cl.
*H01L 51/10* (2006.01)
*H01L 51/05* (2006.01)
*H01L 51/00* (2006.01)

(52) U.S. Cl. .................... 257/40; 257/E51.011; 438/99
(58) Field of Classification Search ............... 257/40, 257/E51.003, E51.005, E51.006, E51.011, 257/E51.025; 438/99
See application file for complete search history.

(56) References Cited

U.S. PATENT DOCUMENTS

| | | | |
|---|---|---|---|
| 5,596,208 A | | 1/1997 | Dodabalapur et al. |
| 6,278,127 B1 | | 8/2001 | Dodabalapur et al. |
| 6,661,024 B1 | * | 12/2003 | Zhang et al. ................. 257/40 |
| 7,029,945 B2 | * | 4/2006 | Veres et al. ................... 438/99 |
| 7,057,206 B2 | * | 6/2006 | Halik et al. ................... 257/40 |
| 2003/0006411 A1 | * | 1/2003 | Kido et al. .................... 257/40 |
| 2003/0054200 A1 | * | 3/2003 | Tagami et al. ............. 428/690 |
| 2004/0108562 A1 | * | 6/2004 | Nagayama et al. ......... 257/434 |
| 2004/0129937 A1 | * | 7/2004 | Hirai ............................ 257/40 |
| 2004/0161873 A1 | * | 8/2004 | Dimitrakopoulos et al. .. 438/99 |

(Continued)

FOREIGN PATENT DOCUMENTS

EP 1083776 A1 * 3/2001

(Continued)

OTHER PUBLICATIONS

Tokito, Noda, and Taga. "Metal Oxides as a Hole-Injection Layer for an Organic Electroluminescent Device." J. Phys. D: Appl. Phys. 29 (1996): 2750-2753.*

(Continued)

*Primary Examiner*—B. William Baumeister
*Assistant Examiner*—Matthew W. Such
(74) *Attorney, Agent, or Firm*—Greenblum & Bernstein, P.L.C.

(57) ABSTRACT

To provide an organic field effect transistor with stable characteristics and a long life span, an organic field effect transistor includes a gate electrode 8 formed on an organic semiconductor film 2 made of an organic semiconductor material with a gate insulating film 3 interposed therebetween; and a source electrode 6 and a drain electrode 7 provided so as to come in contacts with the organic semiconductor film with the gate electrode 8 interposed therebetween. At least one of the source electrode 6 and the drain electrode 7 is formed in contact with the organic semiconductor film 2 with charge injection layers 4 and 5 made of an inorganic material interposed therebetween.

30 Claims, 11 Drawing Sheets

U.S. PATENT DOCUMENTS

| | | | |
|---|---|---|---|
| 2004/0201064 A1* | 10/2004 | Hirai et al. | 257/347 |
| 2004/0206959 A1* | 10/2004 | Heeger et al. | 257/72 |
| 2005/0057136 A1* | 3/2005 | Moriya et al. | 313/311 |
| 2005/0064623 A1* | 3/2005 | Bao | 438/99 |
| 2005/0093031 A1* | 5/2005 | Akkerman et al. | 257/288 |
| 2005/0133782 A1* | 6/2005 | Klauk et al. | 257/40 |
| 2005/0167703 A1* | 8/2005 | Klauk et al. | 257/225 |

FOREIGN PATENT DOCUMENTS

| | | |
|---|---|---|
| JP | 8-228034 | 9/1996 |
| JP | 2003-303970 | 10/2003 |
| WO | WO 03041184 A2 * | 5/2003 |
| WO | WO 03055275 A1 * | 7/2003 |

OTHER PUBLICATIONS

English language Abstract of JP 8-228034.

English language Abstract of JP 2003-303970.

* cited by examiner

ORGANIC FIELD EFFECT TRANSISTOR AND METHOD OF MANUFACTURING THE SAME

BACKGROUND OF THE INVENTION

1. Field of the Invention

The present invention relates to an organic field effect transistor and a method of manufacturing the same and more particularly, to an organic field effect transistor with a long life span by employing a channel made of an organic semiconductor material.

2. Description of the Related Art

An organic field effect transistor using an organic semiconductor has been researched as a substitute for a transistor made of an inorganic material, such as silicone, which has been widely used, for example, an amorphous silicone thin film transistor used for switching control in a liquid crystal display device, and recently, a device with performance as good as the amorphous silicone thin film transistor has been suggested.

The organic field effect transistor has several characteristics when compared to a field effect transistor (hereinafter, referred to as an inorganic field effect transistor) now widely in use based on a silicone semiconductor.

For example, since an organic field effect transistor can use a relatively flexible material, a flexible circuit can be manufactured and the organic field effect transistor is useful for a flexible device and so like.

In addition, since a vacuum process is not required and elements can be formed by a printing method, the organic field effect transistor can be manufactured through a relatively simple process as compared to the inorganic field effect transistor, which investment for building a fabrication facility can be saved. In addition, the organic field effect transistor has an advantage in that it weighs light compared to the inorganic field effect transistor.

Since the organic field effect transistor has such good characteristics, comprehensive research on the organic field effect transistor is now under way. For example, the structure has been suggested in which a gate insulating layer is formed of a metal oxide or a metal nitride to reduce a gate voltage and a leakage current (for example, see Japanese Patent Laid-Open No. 8-228034).

Another structure has been suggested employing as a channel an organic semiconductor film made of a first p-typed organic material layer and a second n-typed organic material layer contacting with the first p-typed organic material layer for the purpose of improving an ON/OFF ratio of current between a source and a drain (for example, see Japanese Patent Laid-Open No. 2003-303970).

However, even in the above-mentioned organic field effect transistors, the ON/OFF ratio of current between the source and the drain or improvement of a gate insulating film and characteristic stability that is a condition to be met for practical use are not satisfactory.

As factors causing the instability in characteristics of the organic field effect transistor, various factors including decomposition or deterioration of a material itself due to power supply, physical change such as peeling off on the interface between the organic semiconductor layer and the electrode, and deterioration due to moisture or oxygen permeated from the outside are considered, but the exact factor has not been clearly discovered until now.

The current between a source and a drain with respect to a gate voltage (hereinafter, referred to as FET characteristics) and the ratio of current between the source and the drain at the time when a predetermined amount of voltage is applied into a gate electrode (that is, at the time of an ON voltage) against that at the time when no voltage is applied into the gate electrode (that is, at the time of an OFF voltage) (hereinafter, referred to as an ON/OFF ratio) may typical characteristics of the field effect transistor.

When the element characteristics are unstable, the FET characteristics or ON/OFF ratio are gradually changed from the time when the element is fabricated and are deteriorated in proportion to multiplication of power supply time and amount of power. Even in case in which no power is supplied into the element, its element characteristics gradually deteriorate due to oxygen or moisture in the atmosphere.

Therefore, the deterioration of element characteristics makes it difficult for the organic field effect transistor to be in practical use. As a result, improvement is required.

SUMMARY OF THE INVENTION

Accordingly, the present invention is made up to solve the above-mentioned problems and it is an object of the invention to provide an organic field effect transistor in which element characteristics and stability are improved to achieve a long life span.

An organic field effect transistor according to the present invention includes a gate electrode formed on an organic semiconductor film made of an organic semiconductor material with a gate insulating film interposed therebetween; and a source electrode and a drain electrode formed so as to come in contacts with the organic semiconductor film. At least one of the source electrode and the drain electrode is formed so as to come in contact with the organic semiconductor film with a charge injection layer made of an inorganic material interposed therebetween, and the organic semiconductor film has a hole serving as a carrier.

According to the above-mentioned structure, since the charge injection layer formed of an inorganic material is interposed, the charge injection can be easily carried out, a driving voltage can decrease, and stable element characteristics and improved reliability can be achieved. The exact reason why these are possible is unclear but the followings can be considered as a possible answer. That is, in order to easily inject the hole serving as the carrier, the charge injection layer made of an inorganic material is interposed between the channel and the source/drain electrode so that an energy level of the charge injection layer has an average value of an energy level of the channel and an energy level of the source/drain electrode. Typically, in a case in which the inorganic material is used, it is possible to allow it to have a middle energy level by using a p-typed semiconductor as a semiconductor.

An organic field effect transistor according to the present invention includes a gate electrode formed on an organic semiconductor film made of an organic semiconductor material with a gate insulating film interposed therebetween; and a source electrode and a drain electrode formed so as to come in contacts with the organic semiconductor film. At least one of the source electrode and the drain electrode is formed so as to come in contact with the organic semiconductor film with a buffer layer made of an inorganic material interposed therebetween, and the organic semiconductor film has a hole serving as a carrier.

According to the above-mentioned structure, since the buffer layer is interposed, it is possible to improve the stability and reliability of the element characteristics. The exact reason why these are possible is unclear but the followings can be considered as a possible answer. That is, by giving and receiving the charge, oxidation-reduction reaction occurs repeatedly on the interface between the organic semiconductor layer and the source/drain electrode, and thus the source electrode and drain electrode are easily deteriorated. On the other hand, according to the structure in which the buffer layer made of the inorganic material is interposed on the interface between the organic semiconductor layer and the source/drain electrode, adherence is improved due to the presence of the buffer layer, electrodes hardly undergo deterioration and the characteristic change is less after the element is manufactured, and thus an organic field effect transistor with stability and a long life span is expected to be achieved. Considering the fact that an organic semiconductor is vulnerable to reduction reaction, a buffer layer made of an inorganic material is interposed between the organic semiconductor layer and electrodes in order to prevent the organic semiconductor layer from undergoing reduction, thus effectively preventing deterioration from being generated. In addition, making a condition where the organic semiconductor layer hardly undergoes reduction reaction by interposing a stable inorganic material (for example, a nitride) or an oxygen-rich-inorganic material (for example, oxide) between the organic semiconductor layer and the electrodes is considered to one reason. This is especially effective for the drain electrode which the reduction reaction easily occurs and which is an electron supply electrode or a hole discharging electrode.

In addition, the presence of the buffer layer can also prevent concentration of carriers and deterioration.

Furthermore, when platinum or gold is used for an electrode, it serves as a catalyst for the organic semiconductor layer to promote the reaction of the organic semiconductor layer to cause deterioration. However, the deterioration occurred on the interface can be prevented by interposing the buffer layer.

BRIEF DESCRIPTION OF THE DRAWIGNS

Figure 11:
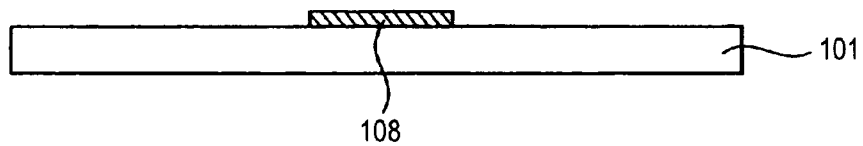
Figure 11:
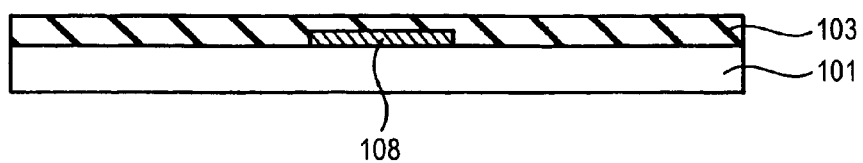
Figure 11:
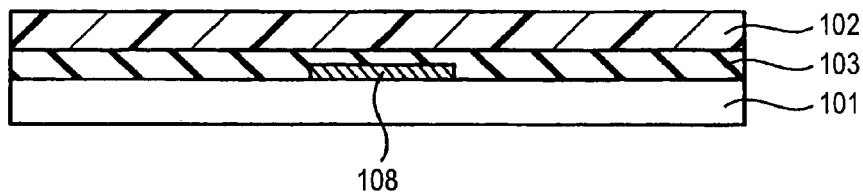
Figure 11:
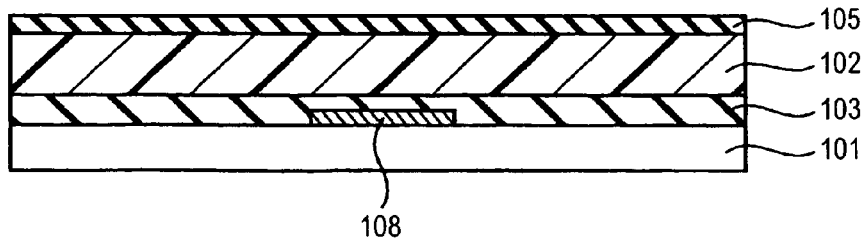
Figure 11:
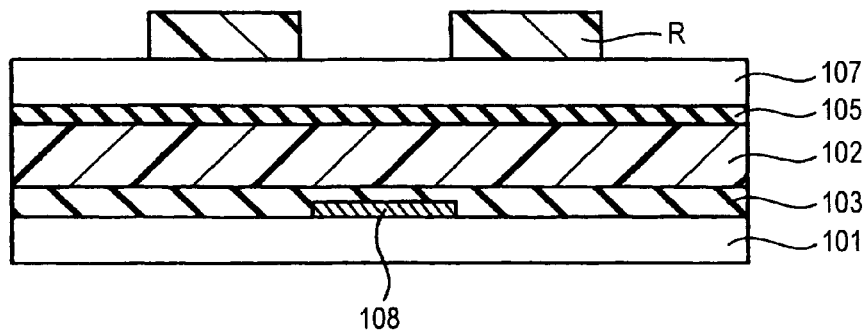

FIG. 11 (a), (b), (c), (d), (e) are process views showing a manufacturing process of an organic field effect transistor according to a second comparative example of the present invention.

Figure 12:
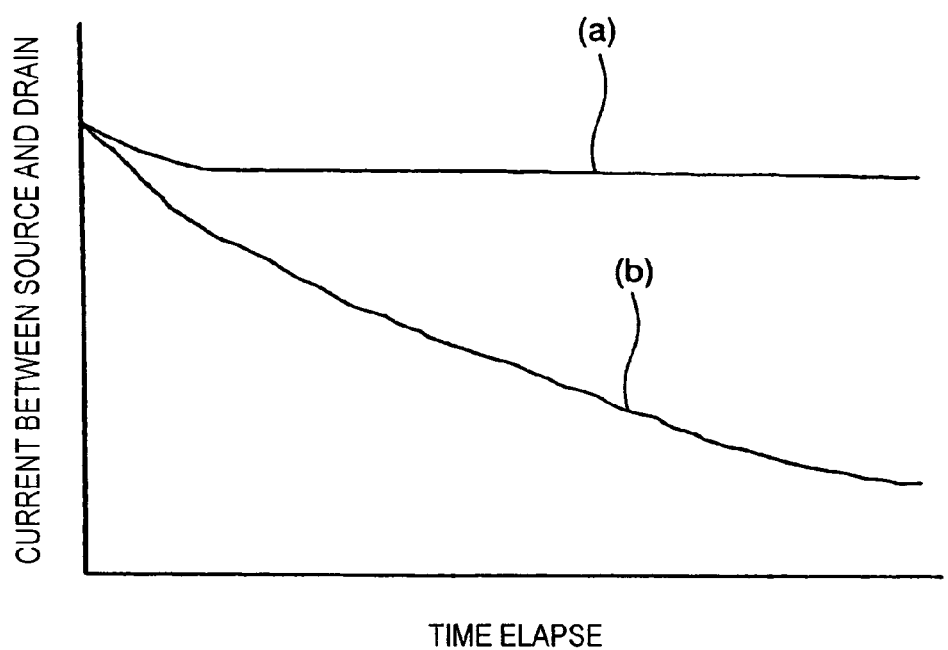

FIG. 12 is a graph showing the change in characteristics at the time of consecutive driving of an organic field effect transistor according to the second comparative example of the present invention.

Figure 13:
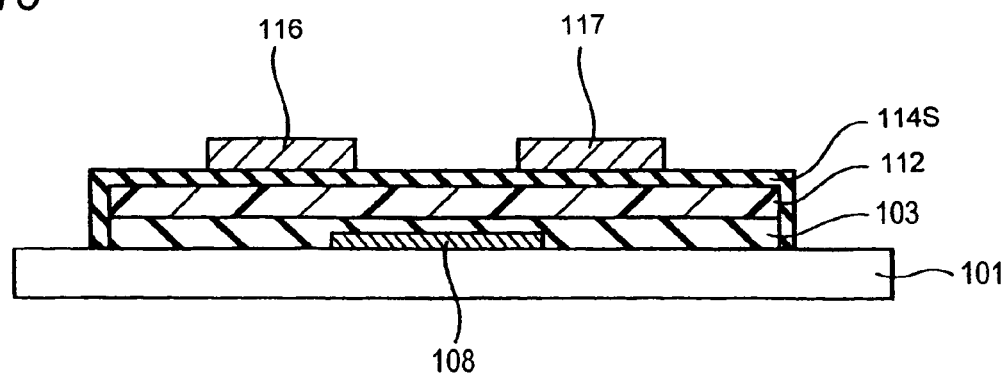

FIG. 13 is a diagram showing an organic field effect transistor according to a sixth embodiment of the present invention.

Figure 14:
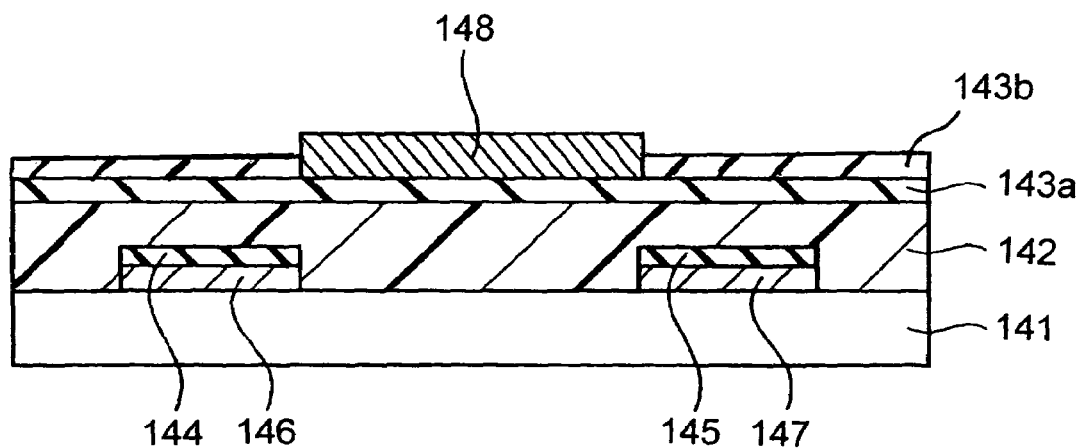

FIG. 14 is a diagram showing an organic field effect transistor according to a seventh embodiment of the present invention.

Figure 15:
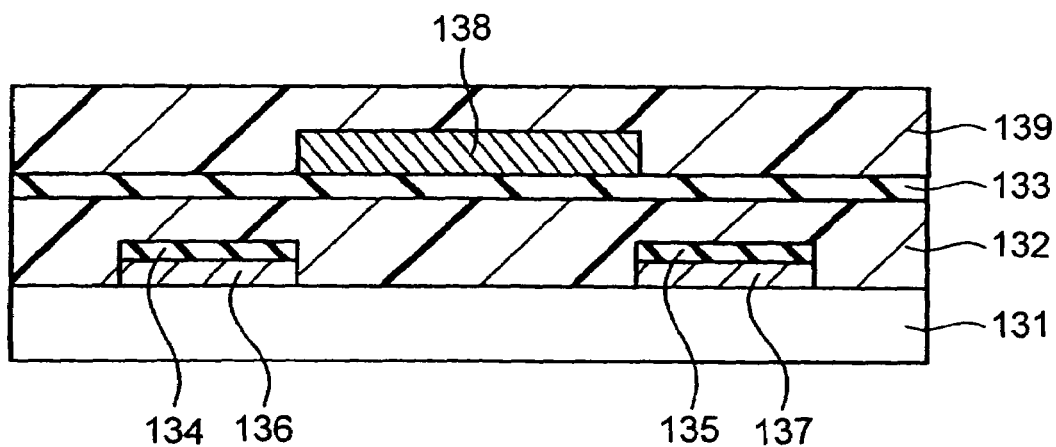

FIG. 15 is a diagram showing an organic field effect transistor according to a eighth embodiment of the present invention.

DESCRIPTION OF THE PREFERRED EMBODIMENTS

An organic field effect transistor according to the present embodiment includes a gate electrode formed on an organic semiconductor film made of an organic semiconductor material with a gate insulating film interposed therebetween; and a source electrode and a drain electrode formed so as to come in contacts with the organic semiconductor film. At least one of the source electrode and the drain electrode is formed so as to come in contact with the organic semiconductor film with a charge injection layer made of an inorganic material interposed therebetween, and the organic semiconductor film has a hole serving as a carrier.

According to the above-mentioned structure, since the charge injection layer formed of an inorganic material is interposed, the charge injection can be easily carried out, a driving voltage can decrease, and stable element characteristics and improved reliability can be achieved. The exact reason why these are possible is unclear but the followings can be considered as a possible answer. That is, in order to easily inject the hole serving as the carrier, the charge injection layer made of an inorganic material is interposed between the channel and the source/drain electrode so that an energy level of the charge injection layer has an average value of an energy level of the channel and an energy level of the source/drain electrode. Typically, in a case in which the inorganic material is used, it is possible to allow it to have a middle energy level by using a p-typed semiconductor as a semiconductor.

Figure 7:
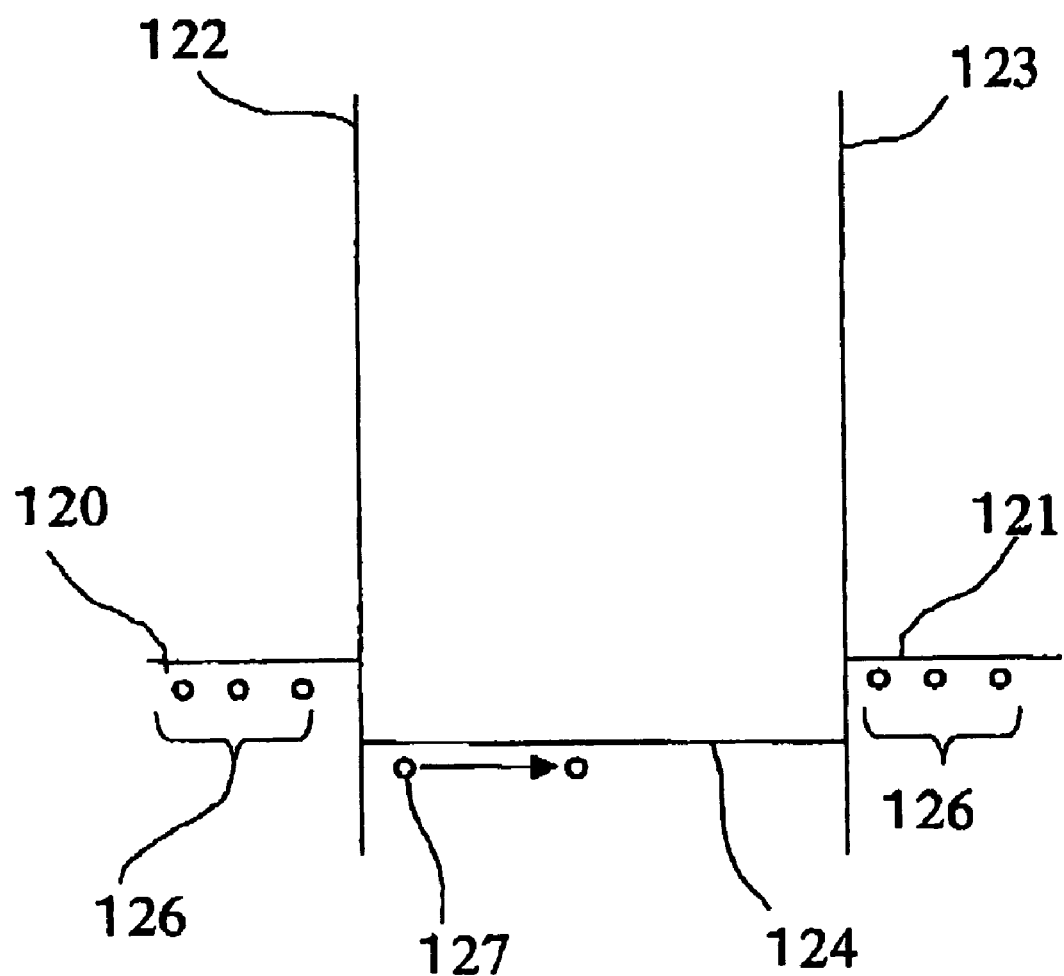
FIG. 7 is a diagram illustrating the structure of an organic field effect transistor according to a prior art.
Figure 8:
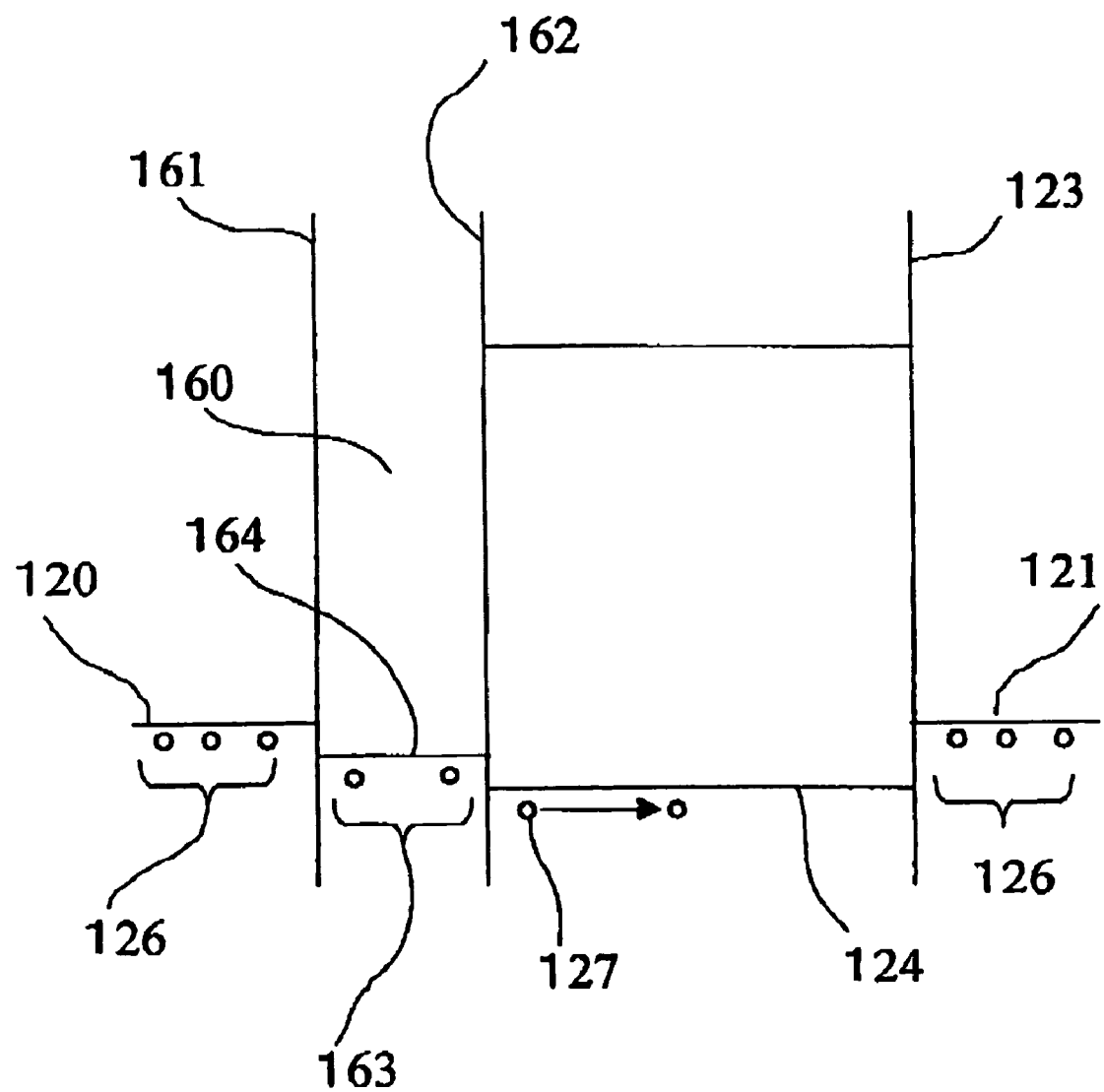
FIG. 8 is a diagram illustrating the structure of the organic field effect transistor according to the prior art.
Figure 9:
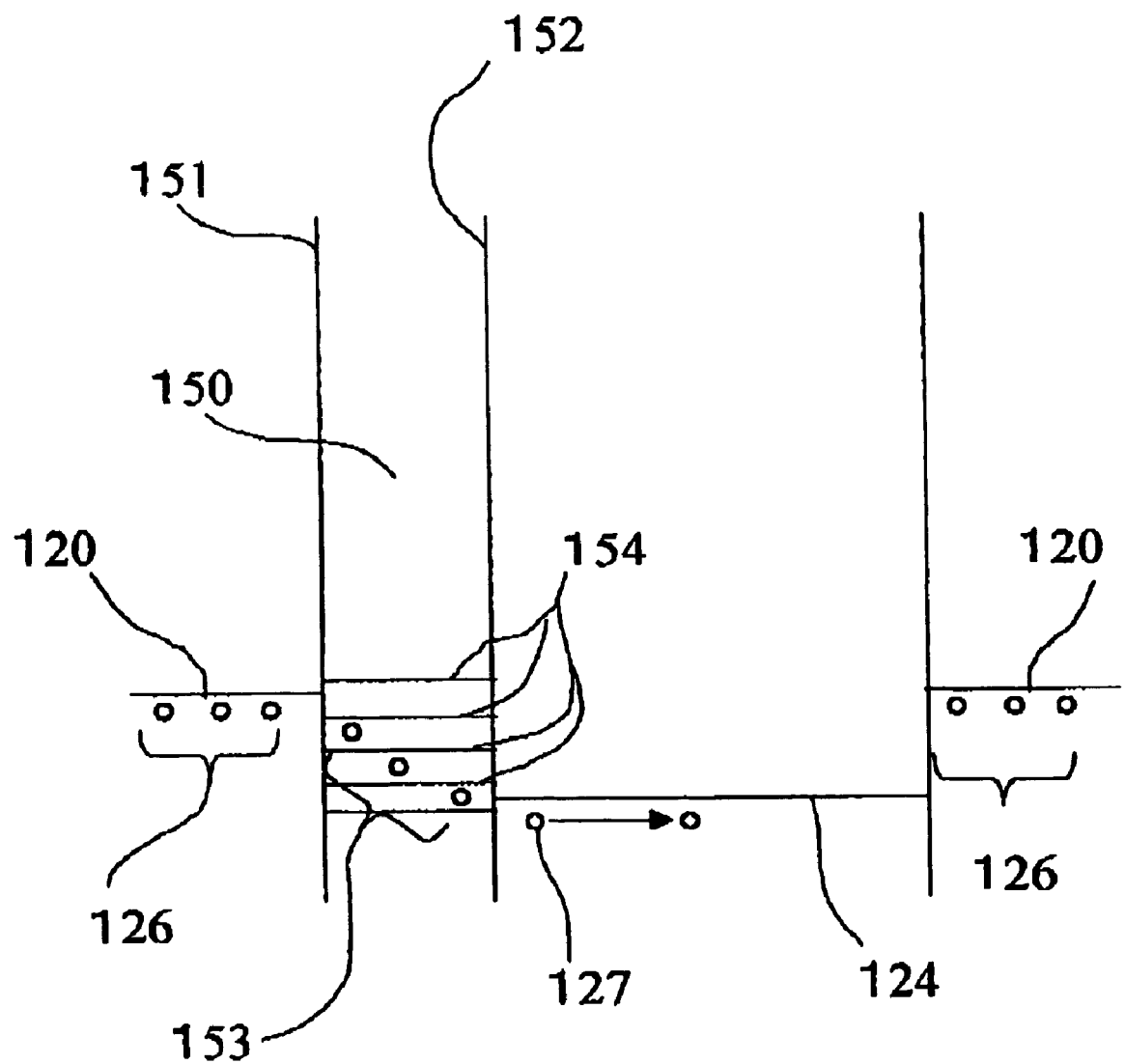
FIG. 9 is a diagram illustrating the structure of another organic field effect transistor according to the present invention.

On the other hand, while a hole has as higher energy as it is located lowly, an electron has as higher energy as it is located highly. Therefore, as illustrated in FIGS. 7-9. a hole (127) in a semiconductor layer (124) has an energy level 120 higher than that of a hole in a source. At this time, in order to inject the hole in the source with a relatively lower energy into the semiconductor layer, an amount of energy corresponding to the energy gap between the hole in the source and the hole in the semiconductor layer should be supplied from the outside and a part of a voltage applied to the element is used for this purpose. Under this circumstance, when the charge injection layer (160) is used, the carrier injection can be carried out with a relatively lower voltage (see FIG. 8: the details will be described as follows).

In addition, by giving and receiving the charge, oxidation-reduction reaction occurs repeatedly on the interface between the semiconductor layer and the source/drain electrode, and thus the source electrode and drain electrode are easily deteriorated. On the other hand, when the charge injection layer made of the inorganic material is used on the interface between the organic semiconductor layer and the source/drain electrode, adherence is improved due to the presence of the charge injection layer, electrodes hardly undergo deterioration and the characteristic change is less after the element is manufactured, and thus an organic field effect transistor with a stability and a long life span is expected to be achieved. Considering the fact that an organic semiconductor is vulnerable to reduction reaction, a charge injection layer made of an inorganic material is interposed between the organic semiconductor layer and electrodes in order to prevent the organic semiconductor layer from undergoing reduction, thus effectively preventing deterioration from being generated. In addition, making a condition where the organic semiconductor layer hardly undergoes reduction reaction by forming a stable inorganic material (for example, a nitride) or an oxygen-rich-inorganic material (for example, oxide) between the organic semiconductor layer and the electrodes is considered to be one reason. This is especially effective for the drain electrode for which the reduction reaction easily occurs and which is an outlet of holes.

In addition, the presence of the charge injection layer can also prevent concentration of carriers and deterioration.

Furthermore, when platinum or gold is used for an electrode, it serves as a catalyst for the organic semiconductor layer to promote the reaction of the organic semiconductor layer to cause deterioration. However, the deterioration occurred on the interface can be prevented by interposing the charge injection layer.

Further, according to the organic field effect transistor of the present embodiment, the charge injection layer contains an oxide.

The organic semiconductor is strong against oxidation while it is vulnerable to reduction. Since it is connected to the electrode with an oxide interposed therebetween, the organic semiconductor film hardly undergo the reduction reaction and has a long life span.

Further, according to the organic field effect transistor of the present embodiment, the charge injection layer contains an oxide of a transitional metal.

Furthermore, according to the organic field effect transistor of the present embodiment, the charge injection layer contains a molybdenum oxide or a vanadium oxide.

As such, the charge injection layer can selectively use an oxide or nitride of a transitional metal which includes molybdenum and vanadium.

For example, since a transitional metal compound takes multiple oxidation and thus has multiple levels of electric potential, it is easy to inject a carrier into the channel on the organic semiconductor layer and it is possible to make a driving voltage lower.

Furthermore, according to the organic field effect transistor of the present embodiment, the charge injection layer contains a nitride.

Since a nitride is stable and has an oxidation preventing function, adherence can be improved, and the metal electrode can be in a stable state without oxidization, and thus preventing the organic semiconductor from deteriorating.

Furthermore, according to the organic field effect transistor of the present embodiment, the charge injection layer contains a nitride of a transitional metal.

There are many kinds of materials in a nitride. Most of them are used as a functional material. Typically, they form a film by a sputtering method or a CVD method. From a material for a semiconductor to a material with an extremely high insulating property, various compound are known.

Among them, as a result of various experiments, when a compound with a high insulating property is employed for film formation, it is desirable for the film to be formed with thickness of about 5 nm or less so as to make carrier injection possible. Employable compounds are exemplified below but titan nitride (TiN) is more desirable. TiN is a very strong material and stable against heat.

Besides, as an employable material, there are gallium nitride (GaN), indium nitride (InN), Aluminum nitride (AlN), boron nitride (BN), silicon nitride (SiN), magnesium nitride (MgN), molybdenum nitride (MoN), calcium nitride (CaN), niobium nitride (NbN), tantalum nitride (TaN), vanadium nitride (VN), zinc nitride (ZnN), zirconium nitride (ZrN), iron nitride (FeN), copper nitride (CuN), barium nitride (BaN), lanthanum nitride (LaN), chrome nitride (CrN), yttrium nitride (YN), lithium nitride (LiN), titan nitride (TiN), and a complex nitride thereof.

According to the organic field effect transistor of the present embodiment, the charge injection layer contains an oxy-nitride.

Since the oxy-nitride has high oxygen resistance and forms a film having high reliability, interface stability can be guaranteed.

Furthermore, according to the organic field effect transistor of the present embodiment, the charge injection layer contains an oxy-nitride of a transitional metal.

For example, since an oxy-nitride crystal of ruthenium (Ru) ($Ru_4Si_2O_7N_2$) has an extremely superior heat-resisting property (1500° C.) and is a stable material, it is proper to form a thin film to serve as the charge injection layer. In this case, the film can be formed by forming a film using a sol-gel method and then performing heat treatment thereon.

Besides, applicable is other oxy-nitride, such as SiAlON of IA, IIA and IIIA groups including barium SiAlON (BaSiAlON), calcium SiAlON (CaSiAlON), cerium SiAlON (CeSiAlON), lithium SiAlON (LiSiAlON), magnesium SiAlON (MgSiAlON), scandium SiAlON (ScSiAlON), yttrium SiAlON (YsiAlON), erbium SiAlON (ErSiAlON), neodymium SiAlON (NdSiAlON) and the like; multiple SiAlON and the like. This kind of layer can be formed using a CVD method or a sputtering method. In addition, LaSiON, $LaEuSi_2O_2N_3$, $SiON_3$ and so on are also applicable. These materials are usually insulator and thus the film using these materials is desirable to be formed thinly, about between 1 to 5 nm. This kind of charge injection layer can also be formed on the region into which holes are forced to move.

Furthermore, according to the organic field effect transistor of the present embodiment, the charge injection layer contains a complex oxide of a transitional metal.

The reason is not unclear, but when a complex oxide of a transitional metal is used for the charge injection layer, stable characteristics are obtained.

There are many kinds of complex oxides and most of them have interesting electronic properties. Specific materials belong thereto can be exemplified as below but not limited thereto.

Any of them can be used for the present embodiment but, among them, barium titanate ($BaTiO_3$) is more desirable. $BaTiO_3$ is a typical dielectric substance and a complex oxide with a high insulating property. A comprehensive research inventors performed showed that the thin film of this substance could serve for injecting a carrier. $BaTiO_3$ and $SrTiO_3$ are chemically stable and have a high dielectric constant, respectively, and thus the effective carrier injection can be performed. A sputtering method, a sol-gel method, a CVD method and the like can be properly used at the time when the film is formed.

As a complex oxide of a transitional metal, there are $BaTiO_3$, $SrTiO_3$, $CaTiO_3$, $KNbO_3$, $BiFeO_3$, $LiNbO_3$, $Na_3VO_4$, $FeVO_3$, $TiVO_3$, $CrVO_3$, $NiVO_3$, $MgVO_3$, $CaVO_3$, $LaVO_3$, $VMoO_5$, $V_2MoO_8$, $LiV_2O_5$, $Mg_2SiO_4$, $MgSiO_3$, $ZrTiO_4$, $SrTiO_3$, $PbMgO_3$, $PbNbO_3$, $BaB_2O_4$, $LaCrO_3$, $LiTi_2O_4$, $LaCuO_4$, $ZnTiO_3$, $CaWO_4$ and so on.

According to the organic field effect transistor of the present embodiment, the organic semiconductor layer is formed of a high molecular weight layer.

In this case, the organic semiconductor layer can be formed by a coating method without a vacuum process.

The above-mentioned compounds and materials can have valence different to the exemplified above and the present embodiment contains these kinds of compounds and materials which are not exemplified.

The organic field effect transistor according to the present embodiment has a gate electrode formed on the surface of a substrate, an organic semiconductor layer formed on the gate electrode with a gate insulating layer interposed therebetween, and a source electrode and a drain electrode formed on the organic semiconductor layer with a charge injection layer interposed therebetween, respectively.

The charge injection layer prevents the organic semiconductor layer from deteriorating during the process of forming the source electrode and the drain electrode.

According to the organic field effect transistor of the present embodiment, the charge injection layer covers the entire surface of the organic semiconductor layer.

According to this structure, a patterning process on the charge injection layer is not required. In addition, since the entire surface of the organic semiconductor layer is covered, it is hard for moisture to permeate thereinto and thus element reliability becomes improved.

The organic field effect transistor according to the present embodiment includes a source electrode and a drain electrode formed at a predetermined interval on a substrate, an organic semiconductor layer formed to cover the source electrode and the drain electrode, and a gate electrode formed on the organic semiconductor layer with a gate insulating film interposed therebetween.

In this way, when the gate insulating film is formed of an organic thin film, the manufacturing process becomes simplified and easy.

According to the organic field effect transistor of the present embodiment, the gate insulating film is formed to cover the entire organic semiconductor layer, and is formed relatively thinner than the other region on the region where the source electrode and the drain electrode are formed.

According to this structure, since the organic semiconductor layer is protected by the gate insulating film, element reliability can be improved.

According to the organic field effect transistor of the present embodiment, the gate insulating film can be formed of two-layered films, except that it is formed of a single film under the gate electrode.

According to this structure, since the gate insulating film is formed thinly under the gate electrode and formed thickly on the other region, the organic semiconductor layer can be protected by the gate insulating film without increasing a driving voltage, and thus a reliable element can be obtained.

A method of manufacturing the organic field effect transistor according to the present embodiment includes steps of forming a gate electrode, forming a gate insulating film, forming an organic semiconductor layer, forming a source electrode and a drain electrode, and forming a charge injection layer on the interface between the source/drain electrode and the organic semiconductor layer.

According to the structure, it is possible to form an organic field effect transistor having a long life span by just adding the process of forming a charge injection layer.

According to the method of manufacturing the organic field effect transistor of the present embodiment, the process of forming the charge injection layer is performed so as to cover the entire surface of the organic semiconductor layer.

According to this process, the surface of the organic semiconductor film can be protected at the same time as forming the charge injection layer, and thus the element characteristics can be easily stable.

According to the present embodiment, since at least one of the source electrode and the drain electrode comes in contact with the organic semiconductor film with the charge injection layer made of an inorganic material interposed therebetween, deterioration of element characteristics can be prevented after the element is manufactured, and thus an organic field effect transistor having a long life span can be provided.

An organic field effect transistor according to the present embodiment includes a gate electrode formed on an organic semiconductor film made of an organic semiconductor material with a gate insulating film interposed therebetween; and a source electrode and a drain electrode formed so as to come in contacts with the organic semiconductor film. At least one of the source electrode and the drain electrode is formed so as to come in contact with the organic semiconductor film with a buffer layer made of an inorganic material interposed therebetween, and the organic semiconductor film has a hole serving as a carrier.

According to the above-mentioned structure, since the buffer layer is interposed, it is possible to improve the stability and reliability of the element characteristics. The exact reason why these are possible is unclear but the followings can be considered as a possible answer. That is, by giving and receiving the charge, oxidation-reduction reaction occurs repeatedly on the interface between the organic semiconductor layer and the source/drain electrode, and thus the source electrode and drain electrode are easily deteriorated. On the other hand, according to the structure in which the buffer layer made of the inorganic material is interposed on the interface between the organic semiconductor layer and the source/drain electrode, adherence is improved due to the presence of the buffer layer, electrodes hardly undergo deterioration and the characteristic change is less after the element is manufactured, and thus an organic field effect transistor with stability and a long life span is expected to be achieved. Considering the fact that an organic semiconductor is vulnerable to reduction reaction, a buffer layer made of an inorganic material is interposed between the organic semiconductor layer and electrodes in order to prevent the organic semiconductor layer from undergoing reduction, thus effectively preventing deterioration from being generated. In addition, making a condition where the organic semiconductor layer hardly undergoes reduction reaction by interposing a stable inorganic material (for example, a nitride) or an oxygen-rich-inorganic material (for example, oxide) between the organic semiconductor layer and the electrodes is considered to one reason. This is especially effective for the drain electrode which the reduction reaction easily occurs and which is an electron supply electrode or a hole discharging electrode.

In addition, the presence of the buffer layer can also prevent concentration of carriers and deterioration.

Furthermore, when platinum or gold is used for an electrode, it serves as a catalyst for the organic semiconductor layer to promote the reaction of the organic semiconductor layer to cause deterioration. However, the deterioration occurred on the interface can be prevented by interposing the buffer layer.

Further, according to the organic field effect transistor of the present embodiment, the buffer layer contains an oxide.

The organic semiconductor is strong against oxidation while it is vulnerable to reduction. Since it is connected to the electrode with an oxide interposed therebetween, the organic semiconductor film hardly undergo the reduction reaction and has the life span long.

Further, according to the organic field effect transistor of the present embodiment, the buffer layer contains an oxide of a transitional metal.

Furthermore, according to the organic field effect transistor of the present embodiment, the buffer layer contains a molybdenum oxide or a vanadium oxide.

As such, the buffer layer can selectively use an oxide or nitride of a transitional metal which includes molybdenum and vanadium.

For example, since a transitional metal compound takes multiple oxidation and thus has multiple levels of electric potential, it is easy to inject a carrier into the channel on the organic semiconductor layer and it is possible to make a driving voltage lower.

Furthermore, according to the organic field effect transistor of the present embodiment, the buffer layer contains a nitride.

Since a nitride is stable and has an oxidation preventing function, adherence can be improved, and the metal electrode can be in a stable state without oxidization, and thus preventing the organic semiconductor from deteriorating.

Furthermore, according to the organic field effect transistor of the present embodiment, the buffer layer contains a nitride of a transitional metal.

There are many kinds of materials in a nitride. Most of them are used as a functional material. Typically, they form a film by a sputtering method or a CVD method. From a material for a semiconductor to a material with an extremely high insulating property, various compound are known. Among them, as a result of various experiments, when a compound with a high insulating property is employed for film formation, it is desirable for the film to be formed with thickness of about 5 nm or less so as to make carrier injection possible. Employable compounds are exemplified below but titan nitride (TiN) is more desirable. TiN is a very strong material and stable against heat.

Besides, as an employable material, there are gallium nitride (GaN), indium nitride (InN), Aluminum nitride (AlN), boron nitride (BN), silicon nitride (SiN), magnesium nitride (MgN), molybdenum nitride (MoN), calcium nitride (CaN), niobium nitride (NbN), tantalum nitride (TaN), vanadium nitride (VN), zinc nitride (ZnN), zirconium nitride (ZrN), iron nitride (FeN), copper nitride (CuN), barium nitride (BaN), lanthanum nitride (LaN), chrome nitride (CrN), yttrium nitride (YN), lithium nitride (LiN), titan nitride (TiN), and a complex nitride thereof.

According to the organic field effect transistor of the present embodiment, the buffer layer contains an oxy-nitride.

Since the oxy-nitride has high oxygen resistance and forms a film having high reliability, interface stability can be guaranteed.

Furthermore, according to the organic field effect transistor of the present embodiment, the buffer layer contains an oxy-nitride of a transitional metal.

For example, since an oxy-nitride crystal of ruthenium (Ru) ($Ru_4Si_2O_7N_2$) has an extremely superior heat-resisting property (1500° C.) and is a stable material, it is proper to form a thin film to serve as the buffer layer. In this case, the film can be formed by forming a film using a sol-gel method and then performing heat treatment thereon.

Besides, applicable is other oxy-nitride, such as SiAlON of IA, IIA and IIIA groups including barium SiAlON (BaSiAlON), calcium SiAlON (CaSiAlON), cerium SiAlON (CeSiAlON), lithium SiAlON (LiSiAlON), magnesium SiAlON (MgSiAlON), scandium SiAlON (ScSiAlON), yttrium SiAlON (YsiAlON), erbium SiAlON (ErSiAlON), neodymium SiAlON (NdSiAlON) and the like; multiple SiAlON and the like. This kind of layer can be formed using a CVD method or a sputtering method. In addition, LaSiON, $LaEuSi_2O_2N_3$, $SiON_3$ and so on are also applicable. These materials are usually insulator and thus the film using these materials is desirable to be formed thinly, about between 1 to 5 nm. This kind of compound has an exciton trapping effect and it can also be formed on the region into which holes are forced to move.

Furthermore, according to the organic field effect transistor of the present embodiment, the buffer layer contains a complex oxide of a transitional metal.

The reason is not unclear, but when a complex oxide of a transitional metal is used for the buffer layer, stable characteristics are obtained.

There are many kinds of complex oxides and most of them have interesting electronic properties. Specific materials belong thereto can be exemplified as below but not limited thereto.

Any of them can be used for the present embodiment but, among them, barium titanate ($BaTiO_3$) is more desirable. $BaTiO_3$ is a typical dielectric substance and a complex oxide with a high insulating property. A comprehensive research inventors performed showed that the thin film of this substance could serve for injecting a carrier. $BaTiO_3$ and $SrTiO_3$ are chemically stable and have a high dielectric constant, respectively, and thus the effective carrier injection can be performed. A sputtering method, a sol-gel method, a CVD method and the like can be properly used at the time when the film is formed.

As a complex oxide of a transitional metal, there are $BaTiO_3$, $SrTiO_3$, $CaTiO_3$, $KNbO_3$, $BiFeO_3$, $LiNbO_3$, $Na_3VO_4$, $FeVO_3$, $TiVO_3$, $CrVO_3$, $NiVO_3$, $MgVO_3$, $CaVO_3$, $LaVO_3$, $VMoO_5$, $V_2MoO_8$, $LiV_2O_5$, $Mg_2SiO_4$, $Mg_2SiO_3$, $ZrTiO_4$, $SrTiO_3$, $PbMgO_3$, $PbNbO_3$, $BaB_2O_4$, $LaCrO_3$, $LiTi_2O_4$, $LaCuO_4$, $ZnTiO_3$, $CaWO_4$ and so on.

According to the organic field effect transistor of the present embodiment, the organic semiconductor layer is formed of a high molecular weight layer.

In this case, the organic semiconductor layer can be formed by a coating method without a vacuum process.

The above-mentioned compounds and materials can have valence different to the exemplified above and the present embodiment contains these kinds of compounds and materials which are not exemplified.

The organic field effect transistor according to the present embodiment has a gate electrode formed on the surface of a substrate, an organic semiconductor layer formed on the gate electrode with a gate insulating layer interposed therebetween, and a source electrode and a drain electrode formed on the organic semiconductor layer with a buffer layer interposed therebetween, respectively.

The buffer layer prevents the organic semiconductor layer from deteriorating during the process of forming the source electrode and the drain electrode.

According to the organic field effect transistor of the present embodiment, the buffer layer covers the entire surface of the organic semiconductor layer.

According to this structure, a patterning process on the buffer layer is not required. In addition, since the entire surface of the organic semiconductor layer is covered, it is hard for moisture to permeate thereinto and thus element reliability becomes improved.

The organic field effect transistor according to the present embodiment includes a source electrode and a drain electrode formed at a predetermined interval on a substrate, an organic semiconductor layer formed to cover the source electrode and the drain electrode, and a gate electrode formed on the organic semiconductor layer with a gate insulating film interposed therebetween.

In this way, when the gate insulating film is formed of an organic thin film, the manufacturing process becomes simplified and easy.

According to the organic field effect transistor of the present embodiment, the gate insulating film is formed to cover the entire organic semiconductor layer, and is formed relatively thinner than the other region on the region where the source electrode and the drain electrode are formed.

According to this structure, since the organic semiconductor layer is protected by the gate insulating film, element reliability can be improved.

According to the organic field effect transistor of the present embodiment, the gate insulating film can be formed of two-layered films, except that it is formed of a single film under the gate electrode.

According to this structure, since the gate insulating film is formed thinly under the gate electrode and formed thickly on the other region, the organic semiconductor layer can be protected by the gate insulating film without increasing a driving voltage, and thus a reliable element can be obtained.

A method of manufacturing the organic field effect transistor according to the present embodiment includes steps of forming a gate electrode, forming a gate insulating film, forming an organic semiconductor layer, forming a source electrode and a drain electrode, and forming a buffer layer on the interface between the source/drain electrode and the organic semiconductor layer.

According to the structure, it is possible to form an organic field effect transistor having a long life span by just adding the process of forming a buffer layer.

According to the method of manufacturing the organic field effect transistor of the present embodiment, the process of forming the buffer layer is performed so as to cover the entire surface of the organic semiconductor layer.

According to this process, the surface of the organic semiconductor film can be protected at the same time as forming the buffer layer, and thus the element characteristics can be easily stable.

According to the present embodiment, since at least one of the source electrode and the drain electrode comes in contact with the organic semiconductor film with the buffer layer made of an inorganic material interposed therebetween, deterioration of element characteristics can be prevented after the element is manufactured, and thus an organic field effect transistor having a long life span can be provided.

First Embodiment

The present invention has the structure that at least one of a source electrode and a drain electrode come in contact with an organic semiconductor film made of an organic semiconductor material with a charge injection layer made of an inorganic material interposed to achieve stable element characteristics.

Figure 1:
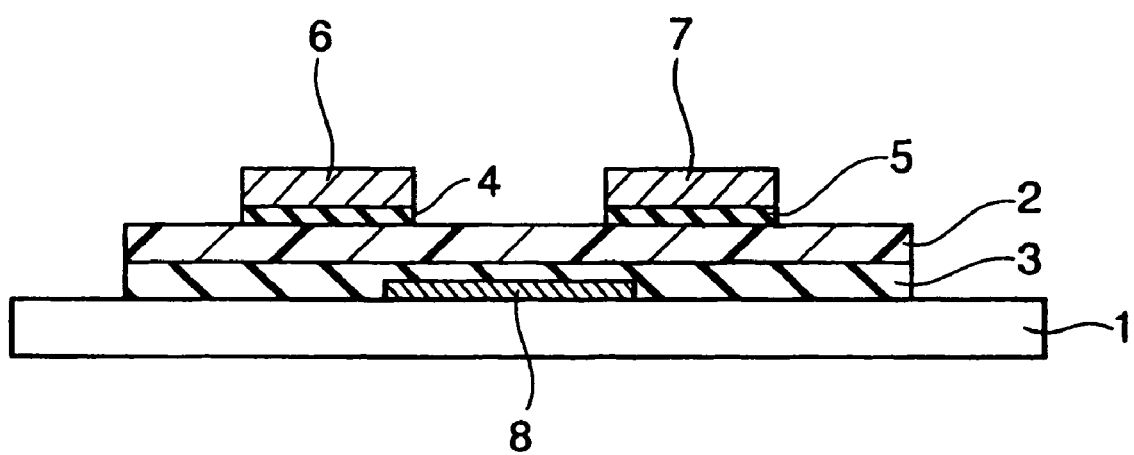
FIG. 1 is a diagram showing an organic field effect transistor according to a first embodiment of the present invention.

FIG. 1 shows the structure of an organic field effect transistor. It has the stack structure where source and drain electrodes 6 and 7 and a gate electrode 8 are formed so as to be opposite to each other with an organic semiconductor film 2 formed above a substrate 1 interposed. A source-side charge injection layer 4 and a drain-side charge injection layer 5 are formed between the source electrode 6 and the organic semiconductor film 2 and between the drain electrode 7 and the organic semiconductor film 2, respectively.

According to the invention having the above-mentioned structure, stable element characteristics can be achieved and an organic field effect transistor with a long life span can be obtained.

For the substrate 1, a glass is generally used, but a pliable material, such as a plastic film, can be also used to maximize the flexibility of organic materials. In addition, various high molecular weight materials, such as polyethyleneterephtalate, polycarbonate, polymethylmethacrylate, polyethersulfone, polyvinyl fluoride, polypropylene, polyethylene, polyacrylate, amorphous polyolefin, fluororesin and the like, or a compound semiconductor substrate made of materials, such as a silicon wafer, gallium arsenide, gallium nitride and the like can be also used.

For the organic semiconductor film, various kinds of composition can be used and its characteristics can be changed depending on whether it is crystal or amorphous. However, in all cases, the operation of a field effect transistor that a gate voltage is applied so as to flow a current between the gate electrode and the source electrode is the same. Thus, for the organic semiconductor film 2, all materials that could perform such a function can be used.

For the typical materials useful for the organic semiconductor film 2, the followings can be exemplified but not limited thereto: a propylene compound such as merocyanine dye and phthalocyanine dye; a carbon fused ring compound made of a plurality of benzene ring coupled with each other, such as pentacene, and derivatives thereof; a heterocyclic compound, such as thiophene, pyrrole, PEDOT (polyethylenedioxythiophene) and the polymer thereof; and a conjugated high molecular weight compound, such as polyphenylenevinylene (PPV) and polyfluorene (PF).

The organic semiconductor film 2 can be used as it is so as to have desired conductivity, but after film formation, it is more desirable to perform a doping treatment thereon so as to contain, for example, a material containing a functional group, such as acrylic acid, acetamide, a dimethylamino group, a cyano group, a carboxyl group and a nitro group; a material serving as an electron acceptor such as benzoquinone derivatives, tetracyanoethylene, tetracyanoquinodimethan and derivatives thereof; a material having a functional group such as an amino group, a triphenyl group, an alkyl group, a hydroxyl group, an alkoxy group and a phenyl group; and materials serving as an electron donor, such as substituted amine like phenylenediamine, anthracene, benzoanthracene, substituted benzoanthracene, pyrene, substituted pyrene, carbazole and derivatives thereof, and tetrathiafulvalene and derivatives thereof.

In addition, the doping means a process which introduces an electron accepting molecule (acceptor) or an electron donor molecule (donor) into the organic semiconductor film as a dopant. Therefore, an organic semiconductor film subject to a doping treatment has a film containing a fused polycyclic aromatic compound and a dopant. As a dopant used for the invention, either an acceptor or a donor can be used. For an acceptor, the followings can be employed: a halogen such as $Cl_2$, $Br_2$, $I_2$, ICl, $ICl_3$, IBr and IF; a Louis acid such as $PF_5$, $AsF_5$, $SbF_5$, $BF_3$, $BCl_3$, $BBr_3$, and $SO_3$; a proton acid such as HF, HCl, $HNO_3$, $H_2SO_4$, $HClO_4$, $FSO_3H$, $ClSO_3H$, and $CF_3SO_3H$; an organic acid such as acetic acid, formate and amino acid; a transition metal compound such as $FeCl_3$, FeOCl, $TiCl_4$, $ZrCl_4$, $HfCl_4$, $NbF_5$, $NbCl_5$, $TaCl_5$, $MoCl_5$, $WF_5$, $WCl_6$, $UF_6$, $LnCl_3$ (Ln=lanthanoid such as La, Ce, Nd and Pr, and Y); and electrolyte anion such as $Cl^-$, $Br^-$, $I^-$, $ClO_4^-$, $PF_6^-$, $AsF_5^-$, $SbF_6^-$, $BF_4^-$ and sulfonic acid anion. For the donor, the followings can be exemplified; an alkali metal, such as Li, Na, K, Rb and Cs; an alkali earth metal, such as Ca, Sr and Ba; a rare earth metal such as Y, La, Ce, Pr, Nd, Sm, Eu, Gd, Tb, Dy, Ho, Er and Yb; and ammonium ion, $R_4P^+$, $R_4As^+$, $R_3S^+$ and acetylcolin.

For the method of introducing a dopant, either a method of forming the organic semiconductor film and then introducing a dopant onto the organic semiconductor film or a method of introducing the dopant during the organic semiconductor film forming process can be employable. The former can be performed by a vapor doping method using a dopant in a gas state, a liquid doping method performed by contacting a solution or a dopant in a liquid state to the organic semiconductor film, or a solid doping method performed by contacting a dopant in a solid state to the organic semiconductor film and then diffusing it into the film. In the liquid doping method, the doping efficiency and the concentration of the dopant can be controlled by electrolysis. The latter can be carried out by simultaneously applying a mixture or dispersion of an organic semiconductor compound and a dopant, and then performing a dry treatment. For example, when a vacuum deposition method is employed, the dopant can be introduced by depositing the dopant and the organic semiconductor compound at the same time. When a sputtering method is employed to form the film, the dopant is introduced in the film by performing the sputtering method using two targets for the organic semiconductor compound and the dopant.

As a method for forming the organic semiconductor film, a vacuum deposition method, a molecular beam epitaxial growth method, an ion cluster beam method, a low energy ion beam method, an ion plating method, a CVD method, a sputtering method, a plasma polymerization method, an electrolysis polymerization method, a chemical polymerization method, a spray coating method, a spin coating method, a blade coating method, a deep coating method, a cast method, a roll coating method, a bar coating method, a die coating method, an inkjet method, an LB method and so on can be exemplified, one or more of them can be properly selected depending on the material employed. Among them, considering productivity, the spin coating method, the blade coating method, the deep coating method, the roll coating method, the bar coating method and the die coating method which use an organic semiconductor compound to form a thin film simply and precisely, are more desirable. The thickness of the organic semiconductor film is not especially limited. However, the characteristics of the obtained transistor tend to depend on the thickness of the organic semiconductor film and are different according to kinds of the organic semiconductors. In addition, it is desirable for the thickness to be 1 μm or less, more preferably, 10 to 300 nm.

It is necessary that the gate insulating film 3 have a high insulating property and high resistance against an insulating destruction. In order to apply a strong electric field into the organic semiconductor film 2, the gate insulating film 3 is desirable to be formed thinly. However, when it is too thin, the applied gate voltage can destroy the gate insulating film 3. As a result, a material used for the gate insulating film should be properly selected considering a dielectric constant and so on.

For the gate insulating film 3, the followings are employable but not limited thereto: a polymer thin film such as polyvinylphenol, polyparaxylene and derivatives thereof, polyimide and derivatives thereof, polyacrylonitrile, polymethacrylatemethyl, polystyrene, polyphenol derivatives, polyurea, polyethylene, polypropylene, polyvinyl chloride, polyvinylidene chloride, polyvinyl fluoride, polyvinylidene fluoride, and acetylcellulose and derivatives thereof; a metal oxide thin film made of metal such as aluminum; an inorganic oxide thin film such as a silicon oxide; an inorganic nitride thin film such as silicon nitride; or combination thereof. For the process of forming the gate insulating film 3, the followings are employable but not limited thereto: a wet method using a spin coating method; a dry method of forming an organic thin film by vacuum deposition; a method of forming a thin film using electrolysis; an electrolytic polymerization method; a method of forming a silicone oxide or an aluminum thin film by a spin coating method.

The source-side charge injection layer 4 and the drain-side charge injection layer 5 are provided such that the source electrode 6 and drain electrode 7 does not directly contact with the organic semiconductor film 2. In addition, they are constructed such that the current flowing into the organic semiconductor film 2 passes through the source-side charge injection layer 4 and the drain-side charge injection layer 5.

As materials for the source-side charge injection layer 4 and the drain-side charge injection layer 5, the following materials can be employed: an oxide such as Mo, Cr, W, V, Nb, Ta, Ti, Zr, Hf, Sc, Y, a rare earth element from La to Lu, Th, Mg, Fe, Ru, Os, Co, Ni, Cu, Zn, Cd, Al, Ga, In, Si, Ge, Sn, Pb, Sb, Bi; a nitride thereof; a complex oxide thereof; combination thereof; a complex oxide of alkali metal or alkali earth metal therewith; and a complex nitride of alkali metal or alkali earth metal therewith.

In addition, the source-side charge injection layer 4 and the drain-side charge injection layer 5 can be formed with the above-mentioned materials using a typical method for forming a thin film, such as a vacuum deposition method using a resistor heating method, an electron beam deposition method, a sputtering method, a CVD method, and a FVD method.

At this time, the thickness of the layer is properly determined depending on the material employed. Generally, it is preferable that it is within a range of 1 nm to 1 μm and it is more preferable that it is within a range of 3 to 100 nm.

In addition, when the thickness of the source-side charge injection layer 4 and the drain-side charge injection layer 5 is too thin, it is hard to obtain a thin film with a uniform thickness. In contrast, when it is too thick, electric resistance increases, the driving voltage increase, so that the uniformity of the film becomes deteriorated.

In addition, since it is not necessary that the source-side charge injection layer 4 and the drain-side charge injection layer 5 have the same material and thickness, they may have a material and thickness different from each other. These can be properly determined depending on the operation hoped for the organic field effect transistor, that is, the applied voltage or power and whether the element is driven in direct-current wise or alternating-current wise.

For the source electrode 6, the drain electrode 7 and the gate electrode 8, an organic conductive film such as PEDOT and a conductive thin film such as a metal are used. For example, the followings can be employed: Au, Cu, Al, Pt, Cr, Pd, In, Ni, Mg, Ag, Ga and an alloy thereof; an oxide semiconductor such as Sn—In oxide, polysilicone, amorphous silicone, Tin (Sn) Oxide, Indium (In) oxide, and Titanium(Ti) oxide; and a chemical semiconductor such as AsGa and GaN.

In addition, when the source-side charge injection layer 4 and the drain-side charge injection layer 5 are formed of the above-mentioned materials, a Schottky barrier may be formed between the source electrode 6 and the source-side charge injection layer 4 and between the drain electrode 7 and the drain-side charge injection layer 5. The Schottky barrier causes a useless driving voltage increase and rectification when the organic field effect transistor is driven, and thus it interferes with the operation of the organic field effect transistor. Therefore, it is necessary to minimize the Schottky barrier by selecting the material of the charge ejection layer.

Therefore, the material for forming the source electrode 6 and the drain electrode 7 are preferably selected as materials that can minimize the Schottky barriers formed therebetween, respectively.

In addition, since the gate electrode 8 is insulated with the gate insulating film 3 and the carrier is not basically introduced from the gate electrode, there is no need for considering the Schottky barrier. However, since the difference between a work function of each of the gate electrode 8 and the organic semiconductor film 2 is reflected on a threshold voltage, it is necessary to suitably select the material of the gate electrode 8 when the threshold voltage is close to the difference between the work function.

The reason why good characteristics is obtained when a thin film made of molybdenum oxide is employed as the charge injection layer is not clear, but the following could be drawn as a possible answer, considering the general charge injection mechanism. The following description is just assumption, and the real reason is not clarified yet.

FIG. 7 shows an energy state of a charge of a simple organic field effect transistor. FIG. 8 is an explanatory view showing an energy state of a charge of an organic field effect transistor where a PEDOT layer serving as a charge injection layer is added to the element structure of FIG. 7. FIG. 9 is an explanatory view showing an energy state of a charge of an organic field effect transistor where a molybdenum oxide layer serving as the charge injection layer is added to the element structure of FIG. 8.

In FIG. 7, a reference numeral 120 indicates a line showing an energy level of the source electrode, a reference numeral 121 indicates a line showing an energy level of the drain electrode, a reference numeral 122 indicates a line showing an interface between the source electrode and a functional layer functioning as a switch (hereinafter, referred to as a semiconductor layer), a reference numeral 123 indicates a line showing an interface between the drain electrode and the semiconductor layer, a reference numeral 124 indicates a highest occupied molecular orbital of the semiconductor layer (hereinafter, referred to as HOMO), a reference numeral 125 indicates a lowest unoccupied molecular orbital (hereinafter, referred to as LUMO), a reference numeral 126 indicates a hole on the source and a reference numeral 127 is a hole injected into the semiconductor layer. In the structure of this transistor, a p-typed semiconductor is employed for the semiconductor layer and a carrier is a hole.

In addition, referring to FIG. 8, a reference numeral 160 indicates a region of PEDOT functioning as the charge injection layer, a reference numeral 161 indicates a line showing an interface between the source and the PEDOT layer, a reference numeral 162 indicates a line showing an interface between the PEDOT layer and the semiconductor layer, a reference numeral 163 indicates a hole in the PEDOT layer, and a reference numeral 164 indicates a line showing the energy level of PEDOT. In addition, referring to FIG. 9, a reference numeral 150 indicates a region of a thin film made of molybdenum oxide serving as the charge injection layer, a reference numeral 151 indicates a line showing the interface between the source and the thin film made of molybdenum oxide, a reference numeral 152 indicates a line showing the interface between the thin film made of molybdenum oxide and the semiconductor film, a reference numeral 153 indicates a hole in the thin film made of molybdenum oxide and a reference numeral 154 indicates a line showing the energy level of the thin film made of molybdenum oxide.

It should be noted that FIGS. 7, 8 and 9 are just simplified models. The drawings show just the minimum necessary to explain some features, and it is needless to say that that the real operation of the elements is more complicated.

First, the operation of a simple organic field effect transistor will be described with reference to FIG. 7.

As in the inorganic field effect transistor, the switching operation of the organic field effect transistor is performed by a hole or an electron passes through the organic semiconductor layer to become a source current and a drain current. As shown in FIG. 7, the hole 126 on the source is injected into the HOMO 124 of the semiconductor layer and then moves into the drain. The hole 127 injected into the semiconductor layer is forced to move toward the drain electrode in the semiconductor layer according to the applied electric field, and the movement causes a current to be generated.

Next, the charge injection of the present invention will be described in detail below.

Referring to FIG. 7, a line 120 indicates the energy level of the source and a line 124 indicates the HOMO of the semiconductor layer. In FIG. 7, the locations of the lines represent an energy level of an electric field and the difference of the height between the lines 120 and 124 shows the difference of energy levels thereof. The fact the energy level becomes different means that holes under the respective energy levels have different energy levels, respectively. Generally, in FIG. 7, a hole has higher energy as it is lowly located, while an electron has higher energy as it is highly located. Therefore, the holes 127 in the semiconductor layer have higher energy than the holes 126 on the source. In this case, in order to introduce the hole 126 on the source with a lower energy level into the semiconductor layer, an amount of energy corresponding to the difference between the energy level 120 of the holes 126 on the source and the energy level 124 of the holes 127 on the semiconductor layer is required to be supplied from the outside and a part of a voltage applied to the element is used for the purpose.

For injection and extraction of a carrier to cause movement of an electron, it is considered that a voltage corresponding to the difference between energy levels may be applied, but actually, by using the charge injection layer, the injection and extraction of the carrier can be performed by applying substantially a lower voltage. It can be applied to either the source or the drain, and the injection phenomenon of the source-side hole will be further described below.

FIG. 8 is an explanatory view showing an energy level of the organic field effect transistor where the PEDOT 160 serving as the charge injection layer is provided to the drain of the organic transistor element having the simplest structure shown in FIG. 7. The energy level of the PEDOT may be substantially one and it is generally an average level between the energy level of the source and the energy level of the semiconductor layer.

At the time of the hole injection, the hole moves in excess of the energy level from the drain to the semiconductor layer. However, probability of movement is depending on the difference between the average energy level of the hole and the transitional energy level. Since the higher is the average energy level of the hole, the lower is the difference between the energy levels, so that the more holes are injected into the semiconductor layer. In this case, the hole injection is more easily performed in the structure shown in FIG. 8 rather than in the structure shown in FIG. 7 because the energy level 164 of PEDOT have an average value between the energy level 120 of the source and the energy level 124 of the semiconductor layer. When the same amount of voltage is applied in the elements of FIGS. 7 and 8, that is, the same amount of energy, is applied into the holes, there exists the energy level 164 of the PEDOT located at the point showing the smaller difference of the energy levels as compared to the energy level 124 of the semiconductor layer in the element shown in FIG. 8, which the hole movement occurs easily. In addition, the holes reaching the energy level 164 of PEDOT easily moves to the energy level 124 of the semiconductor layer because of the same reason.

This aspect can be easily understood by impersonation. That is, assuming a situation where a person steps up to a higher place, it is easier to get there by two steps via a middle step rather than jumping up there by just one step. This can be applied to the hole injection. The finally obtained potential energy is the same in two cases irrespective of the presence of the middle step, but the way how to get there is much easier in the latter case.

Moreover, according to the present embodiment, the thin film made of molybdenum oxide can achieve the charge injection more easily as compared to the PEDOT. Using the impersonation model again, it is because the thin film made of molybdenum oxide has a middle step while PEDOT does not have the middle step.

In FIG. 9, the thin film 150 made of molybdenum oxide has multiple energy levels 154 which were represented as steps. Since the energy level reaching from the energy level 120 of the source to the energy level 124 of the semiconductor layer are minutely divided, the holes 153 can easily move within the thin film made of molybdenum oxide, which has a plurality of energy levels 154 with small energy differences each other.

The reason why the molybdenum oxide thin film has the plurality of energy levels 154 which are presented by steps is because of the composition of the thin film made of molybdenum oxide.

According to the present embodiment, the thin film made of molybdenum oxide is an amorphous thin film formed by a vacuum deposition method. The vacuum deposition is performed under reduction atmosphere and the molybdenum oxide deposited on a substrate by heating and sublimation undergoes reduction. As the result, the molybdenum oxide undergoing reduction becomes $MoO_3$ with valence 6 containing some amount of oxide with valence less than 6, for example, $MoO_2$ whose valence is 4 and $Mo_2O_3$ whose valence is 3. To undergo reduction means it gain an electron and thus the oxide whose valence become lower by reduction is placed in a state to loose an electron, that is, to accept a hole, easily rather than an oxide with a higher valence. It means that oxide has the energy level line higher than that located in FIGS. 7 to 9.

As the result, the multiple energy level structure 154 of the molybdenum oxide shown in FIG. 9 is obtained. Among the multiple energy levels 154 of the molybdenum oxide shown in FIG. 9, an energy level located at the lowermost corresponds to the molybdenum oxide with valence 6. As an energy level is located at the upper side, valence thereof decreases.

The multiple energy levels 154 represented by the steps are assumed to occur by the reason described above. More correctly, besides the oxide having different valence, the fact that the amorphous film has various energy levels is considered. The energy level of such a material referred to as an oxide or a nitride is determined based on its crystal state. However, in the complicated structure having much dangling bond in as an amorphous film, since the compound can be present either in a much amount or in a small amount, it tends to have the multiple energy levels as described above.

As described above, according to the present invention, it is possible to lower a driving voltage and it is easy to inject holes from the source into the semiconductor layer, which improves the switching characteristics. However, the reason why the element undergoes deterioration rapidly in a region to which a high current is applied is assumed because of heat. According to the present invention, since the molybdenum oxide is an inorganic material and thus it has great resistance against heat essentially, it can keep stable characteristics over a broad range of current region.

Such a great heat resistant characteristics of the molybdenum oxide can be maximized when it is applied for a high molecular weight organic element. Generally, since, in a low molecular weight organic element, the low molecular weight organic compound group constituting a functional layer forms a thin film with a vacuum deposition method to become an amorphous thin film on the substrate, it is vulnerable to a high temperature. Thus, when the functional layer is exposed to a high temperature, crystallization of the low molecular weight organic compound processes to make element characteristics deteriorated. Since the crystallization temperature is at most 100° C., to raise the crystallization temperature above the temperature while sustaining the sublimation characteristics necessary for the deposition is an unsolved problem for the low molecular weight organic material. Thus, when the functional layer, formed of an organic material, such as the semiconductor layer, is vulnerable to heat, even though the molybdenum oxide serving as the charge injection layer has superior heat resistance property, the characteristics cannot be employed.

On the other hand, a high molecular weight organic material is strong to a high temperature condition because the high molecular weight organic material has a complicatedly linked long molecular chain. The high molecular weight organic material does not have an exact crystallization temperature. Instead, it has a glass transition temperature at which the material starts to be soft. Moreover, various high molecular weight organic materials do not have an exact glass transition point. In other words, a high molecular weight organic material hardly undergoes crystallization because of its natural structure even when it is placed under a high temperature condition. Thus, the general characteristics of the high molecular weight organic material are that when the high molecular weight material is applied to the organic element, it has superior strong heat resistance.

As described above, according to this embodiment, an element using the molybdenum oxide uses the molybdenum thin film having strong heat resistance, the stable element can be composed under a severe condition such as a high current density condition and the superior charge injection characteristics anticipated for the molybdenum oxide can be further improved.

Here, it is questionable on the reason why the PEDOT undergoes a rapid deterioration even though it is also a high molecular weight compound. However, this phenomenon is not contradictory to the fact that a high molecular weight compound is strong to heat.

As described above, the reason why the PEDOT element has superior charge injection characteristics is because two kinds of high molecular weight compounds interact. The reason why the PEDOT element undergoes rapid deterioration under a large current density is not because the high molecular weight material forming the PEDOT element deteriorates, but because its physical structure changes. That is, it is because the two kinds of high molecular weight organic compounds are loosely linked to each other by coulomb interaction, and the state of phase decomposition changes. Since the characteristics of the PEDOT mostly depend on its structure and thus when its structure change, the characteristics also changes.

The hole on the semiconductor layer can easily move to the drain, but as will described below, the movement of the hole can be much easier when an inorganic layer such as the molybdenum oxide 160 with multiple energy levels is formed on the drain. In that case, symmetrical band structures are formed on the source and on the drain which are located on the both sides of the semiconductor layer, respectively.

EXAMPLE 1

Next, a first example according to the present invention will be described below. First, an aluminum (Al) thin film is formed on a substrate 1 made of glass by about 500 nm thickness under 0.27 mPa ($2 \times 10^{-6}$ Torr) using a resistant heat deposition apparatus and then patterned using a photolithography method to form a gate electrode 8 (FIG. 2(*a*)).

Figure 2:
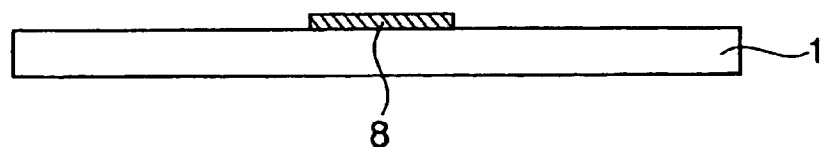
FIG. 2 is a process view showing a manufacturing process of an organic field effect transistor according to a first comparative example of the present invention.
Figure 2:
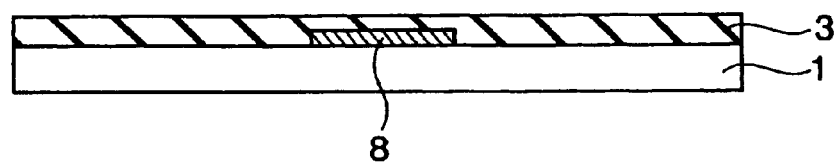
Figure 2:
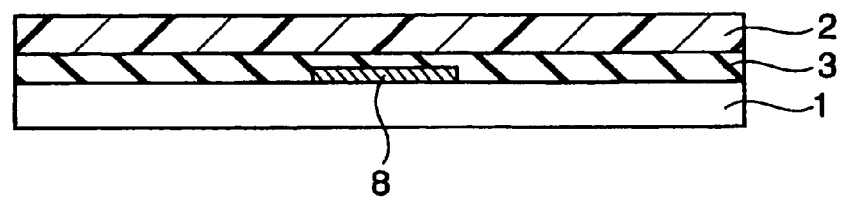
Figure 2:
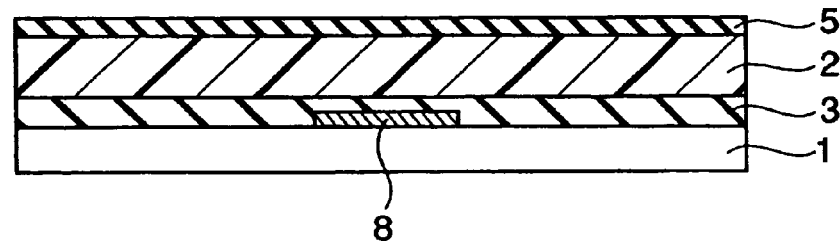
Figure 2:
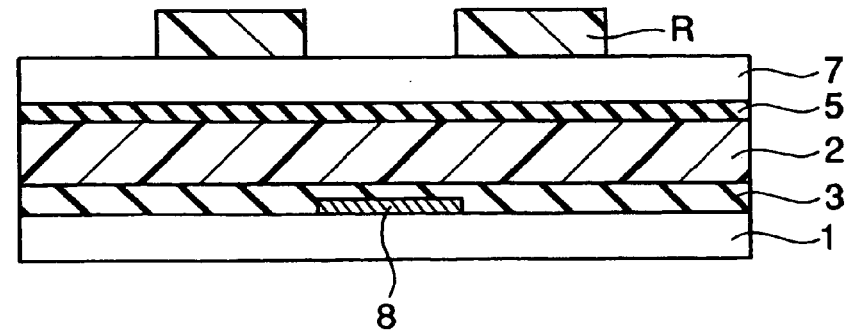

Next, a polyimide film is deposited thereon to form a gate insulating film 3 (FIG. 2(*b*)), polyphenylenevinylene is spin coated thereon and then subject to a heat treatment to form a p-type organic semiconductor film 2 containing polyphenylenevinylene as a main component (FIG. 2(*c*)).

Next, the sample is divided into two samples. A source-side charge injection layer 4 and a drain-side charge injection layer 5 are formed on one sample (hereinafter, referred to as a present sample) and not formed on the other sample (hereinafter, referred to as a comparative sample).

On the present sample, as shown in FIG. 2(*d*), as the source-side charge injection layer 4 and the drain-side charge injection layer 5, a molybdenum oxide M is formed by 20 nm thickness using a vacuum deposition method and then a metal layer M is formed using a vapor deposition method. On the other hand, on the comparative sample, the metal layer M is directly formed using a vapor deposition method without forming the molybdenum oxide layer.

On the two samples, when the metal layer M is vacuum-deposited, a source electrode 6 and a drain electrode 7 are formed using a proper mask, as shown in FIG. 1.

Figure 3:
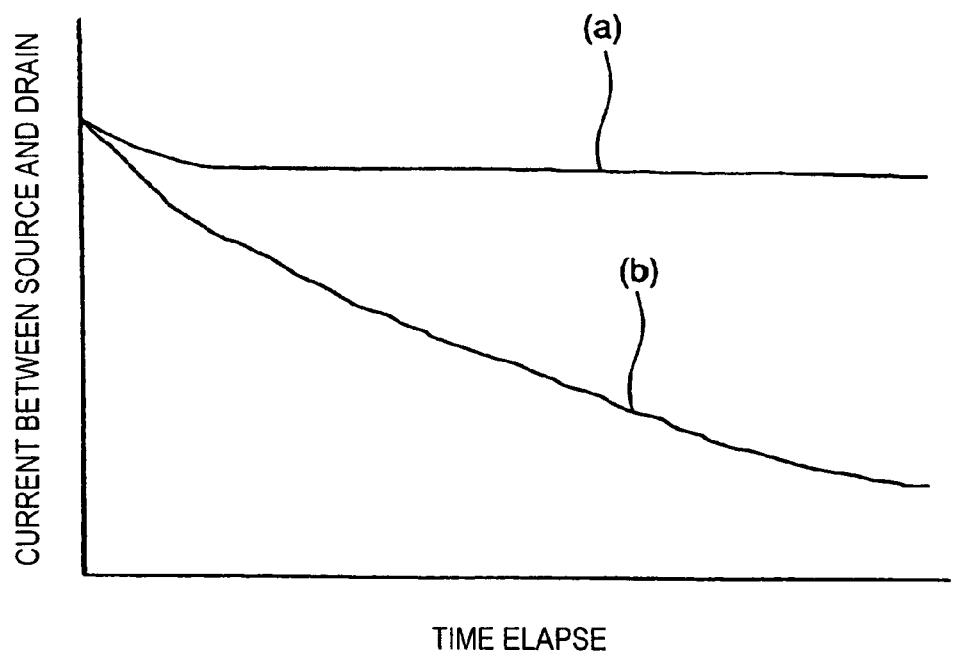
FIG. 3 is a graph showing the change in characteristics at the time of consecutive driving of an organic field effect transistor according to the first comparative example of the present invention.

The organic field effect transistors in the present sample and the comparative sample obtained by the above-mentioned processes are continuously operated, so that characteristic deterioration thereof is evaluated. FIG. 3 is a graph showing the evaluation results. Here, it shows the change of a current between the source and the drain according to time when a gate voltage and a voltage between the source and the drain are fixed. A curve a indicates the current between the source and the drain of the present sample, the curve b indicates the current between the source and the drain of the comparative sample, and the current between the source and the drain is represented as a maximum value.

As apprehended from FIG. 3, on the present sample where the source-side charge injection layer 4 and the drain-side charge injection layer 5 are formed, the current between the source and the drain keeps stable after the its initial operation. But, on the comparative sample, it decreases as time elapses. That is, the present sample has characteristic stability while the comparative sample does not.

The reason why these advantages are obtained is not clear, but it is clear that the driving voltage of an organic field effect transistor decreases and the stable characteristic and a long life span can be achieved when at least one of the source-side charge injection layer and the drain-side charge injection layer is provided.

Second Embodiment

Figure 4:
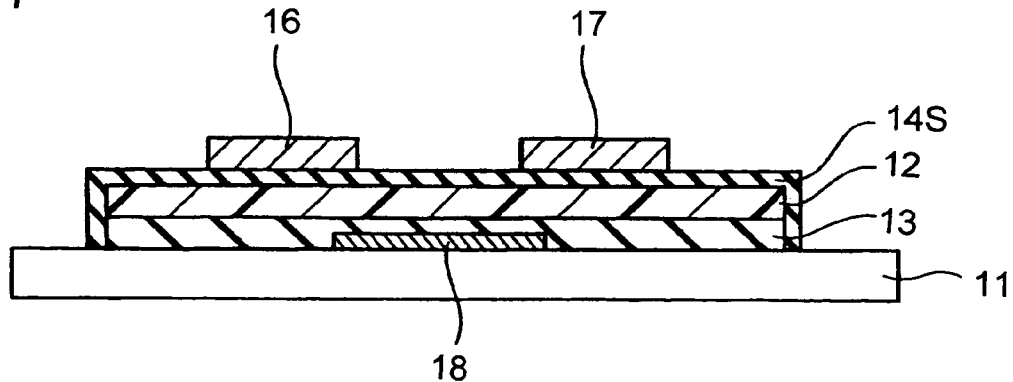
FIG. 4 is a diagram showing an organic field effect transistor according to a second embodiment of the present invention.

Next, a second embodiment according to the present invention will be described below. According to the first embodiment, the source-side charge injection layer 4 and the drain-side charge injection layer 5 have the same patterns as the source electrode 6 and the drain electrode 7, respectively. However, the second embodiment, as shown in FIG. 4, has a structure where the source-side charge injection layer 4 and the drain-side charge injection layer 5 are integrally formed as a charge injection layer 14S formed to cover the entire surface of the organic semiconductor film 12. For the operation thereof, similar to the first embodiment, the charge injection effect can be obtained between the organic semiconductor film 12 and the source and drain electrodes 16 and 17. However, since the charge injection layer 14S covers the entire surface of the organic semiconductor film 12, air is prevented from permeating into the organic semiconductor film vulnerable to moisture and heat, thus preventing the organic semiconductor film from deteriorating. Moreover, gate electrode 18, substrate 11 and insulatina layer 12 are illustrated.

In addition, since the number of the manufacturing process does not increase, it can be easily manufactured. If necessary, the entire surface of the substrate with the source and drain electrodes 16 and 17 formed can be covered with a passivation film to improve its reliability much more.

Third Embodiment

Next, a third embodiment according to the present invention will be described. Unlike the first and second embodiments where the gate electrode is formed on the substrate, respectively, the third embodiment has the structure where a source electrode 26 and a drain electrode 27 are formed on a substrate.

Figure 5:
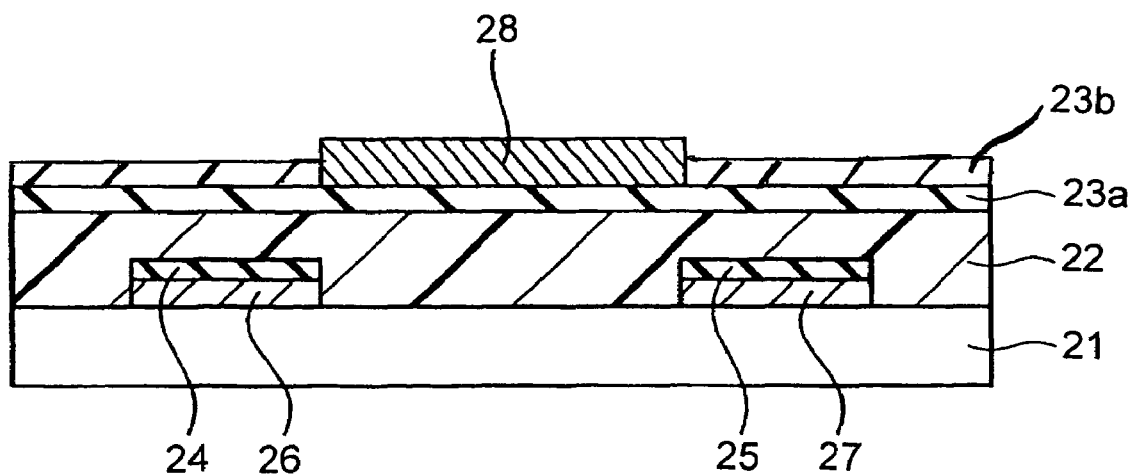
FIG. 5 is a diagram showing an organic field effect transistor according to a third embodiment of the present invention.

As shown in FIG. 5, a titanium nitride (TiN) layer serving as the source-side charge injection layer 24 and the drain-side charge injection layer 25 with a thickness of 1 nm is formed on the source and drain electrodes 26 and 27 having the polycide structure made of a polycrystalline silicon layer formed on the silicon substrate 21 and tungsten silicide. Then, an organic semiconductor film 22 made of PPV is formed thereon, then a gate insulating film 23 formed of a double layer of a silicone oxide film 23*a* and a silicon nitride film 23*b* is formed thereon, then a part of the silicon nitride 23*b* is removed, and a gate electrode 28 made of polycrystalline silicon is formed thereon. According to this structure, since the organic semiconductor film 22 is covered with the gate insulating film with the double layer structure, the organic semiconductor film is hardly oxidized and an element with superior water resistance property can be obtained.

Fourth Embodiment

Next, a fourth embodiment according to the present invention will be described. According to this embodiment, similar to the third embodiment, the source and drain electrodes 36 and 37 are formed on the substrate. However, after forming a gate insulating film 33 using a polyimide film, a gate electrode 38 is formed thereon, and a passivation film 39 made of a polyimide film is formed thereon.

Figure 6:
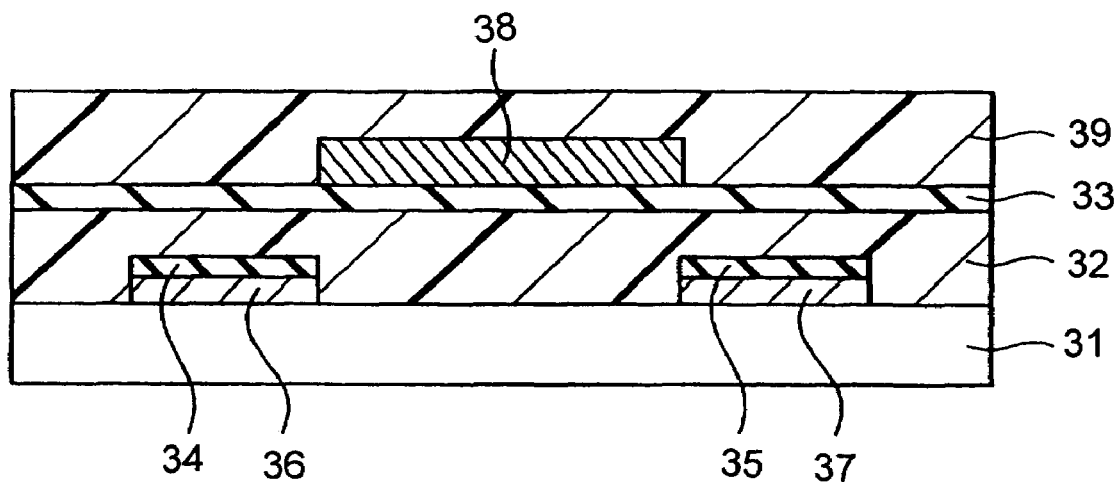
FIG. 6 is a diagram showing an organic field effect transistor according to a fourth embodiment of the present invention.

As shown in FIG. 6, a molybdenum oxide ($MoO_3$) layer serving as a source-side charge injection layer 34 and a drain-side charge injection layer 35 with a thickness of 1 nm are formed on a source electrode 36 and a drain electrode 37 which are made of PEDOT and are formed on a flexible substrate 31 made of a polyimide film. Then, an organic semiconductor film 32 made of Alq is formed thereon, and then a gate insulating film 33 made of a silicone oxide film 33 is formed thereon. Then, a gate electrode 38 made of PEDOT is formed thereon, and then a passivation film 39 made of a polyimide film is formed thereon by a spin coating method.

According to this embodiment, since the organic semiconductor film 32 is covered with the gate insulating film 33 and the passivation film 39, it has superior water resistance, thereby preventing oxidation from generating.

According to the structure, an organic field effect transistor with stable characteristics and a long life span can be obtained.

Since an organic field effect transistor according to the present invention has stable characteristics and a long life span, it is applicable for a switching element of a liquid crystal display device and an organic EL display device or a flexible display device, or for a next generation electronic device.

Fifth Embodiment

The present invention has the structure that at least one of a source electrode and a drain electrode come in contact with an organic semiconductor film made of an organic semiconductor material with a buffer layer made of an inorganic material interposed to achieve stable element characteristics.

Figure 10:
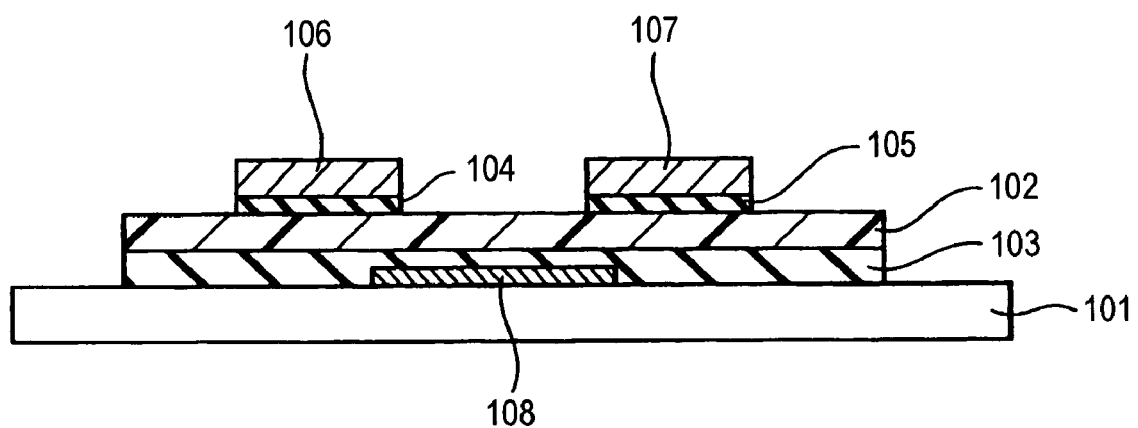
FIG. 10 is a diagram showing an organic field effect transistor according to a fifth embodiment of the present invention.

FIG. 10 shows the structure of an organic field effect transistor. It has the stack structure where source and drain electrodes 106 and 107 and a gate electrode 108 are formed so as to be opposite to each other with an organic semiconductor film 102 formed above a substrate 101 interposed. A source-side buffer layer 104 and a drain-side buffer layer 105 are formed between the source electrode 106 and the organic semiconductor film 102 and between the drain electrode 107 and the organic semiconductor film 102, respectively.

According to the invention having the above-mentioned structure, stable element characteristics can be achieved and an organic field effect transistor with a long life span can be obtained.

For the substrate 101, a glass is generally used, but a pliable material, such as a plastic film, can be also used to maximize the flexibility of organic materials. In addition, various high molecular weight materials, such as polyethyleneterephtalate, polycarbonate, polymethylmethacrylate, polyethersulfone, polyvinyl fluoride, polypropylene, polyethylene, polyacrylate, amorphous polyolefin, fluororesin and the like, or a compound semiconductor substrate made of materials, such as a silicon wafer, gallium arsenide, gallium nitride and the like can be also used.

For the organic semiconductor film, various kinds of composition can be used and its characteristics can be changed depending on whether it is crystal or amorphous. However, in all cases, the operation of a field effect transistor that a gate voltage is applied so as to flow a current between the gate electrode and the source electrode is the same. Thus, for the organic semiconductor film 102, all materials that could perform such a function can be used.

For the typical materials useful for the organic semiconductor film 102, the followings can be exemplified but not limited thereto: a propylene compound such as merocyanine dye and phthalocyanine dye; a carbon fused ring compound made of a plurality of benzene ring coupled with each other, such as pentacene, and derivatives thereof a heterocyclic compound, such as thiophene, pyrrole, PEDOT (polyethylenedioxythiophene) and the polymer thereof; and a conjugated high molecular weight compound, such as polyphenylenevinylene (PPV) and polyfluorene (PF).

The organic semiconductor film 102 can be used as it is so as to have desired conductivity, but after film formation, it is more desirable to perform a doping treatment thereon so as to contain, for example, a material containing a functional group, such as acrylic acid, acetamide, a dimethylamino group, a cyano group, a carboxyl group and a nitro group; a material serving as an electron acceptor such as benzoquinone derivatives, tetracyanoethylene, tetracyanoquinodimethan and derivatives thereof; a material having a functional group such as an amino group, a triphenyl group, an alkyl group, a hydroxyl group, an alkoxy group and a phenyl group; and materials serving as an electron donor, such as substituted amine like phenylenediamine, anthracene, benzoanthracene, substituted benzoanthracene, pyrene, substituted pyrene, carbazole and derivatives thereof, and tetrathiafulvalene and derivatives thereof.

In addition, the doping means a process which introduces an electron accepting molecule (acceptor) or an electron donor molecule (donor) into the organic semiconductor film as a dopant. Therefore, an organic semiconductor film subject to a doping treatment has a film containing a fused polycyclic aromatic compound and a dopant. As a dopant used for the invention, either an acceptor or a donor can be used. For an acceptor, the followings can be employed: a halogen such as $Cl_2$, $Br_2$, $I_2$, ICl, $ICl_3$, IBr and IF; a Louis acid such as $PF_5$, $AsF_5$, $SbF_5$, $BF_3$, $BCl_3$, $BBr_3$, and $SO_3$; a proton acid such as HF, HCl, $HNO_3$, $H_2SO_4$, $HClO_4$, $FSO_3H$, $ClSO_3H$, and $CF_3SO_3H$; an organic acid such as acetic acid, formate and amino acid; a transition metal compound such as $FeCl_3$, FeOCl, $TiCl_4$, $ZrCl_4$, $HfCl_4$, $NbF_5$, $NbCl_5$, $TaCl_5$, $MoCl_5$, $WF_5$, $WCl_6$, $UF_6$, $LnCl_3$ (Ln=lanthanoid such as La, Ce, Nd and Pr, and Y); and electrolyte anion such as $Cl^-$, $Br^-$, $I^-$, $ClO_4^-$, $PF_6^-$, $AsF_5^-$, $SbF_6^-$, $BF_4^-$ and sulfonic acid anion. For the donor, the followings can be exemplified: an alkali metal, such as Li, Na, K, Rb and Cs; an alkali earth metal, such as Ca, Sr and Ba; a rare earth metal such as Y, La, Ce, Pr, Nd, Sm, Eu, Gd, Tb, Dy, Ho, Er and Yb; and ammonium ion, $R_4P^+$, $R_4As^+$, $R_3S^+$ and acetylcolin.

For the method of introducing a dopant, either a method of forming the organic semiconductor film and then introducing a dopant onto the organic semiconductor film or a method of introducing the dopant during the organic semiconductor film forming process can be employable. The former can be performed by a vapor doping method using a dopant in a gas state, a liquid doping method performed by contacting a solution or a dopant in a liquid state to the organic semiconductor film, or a solid doping method performed by contacting a dopant in a solid state to the organic semiconductor film and then diffusing it into the film. In the liquid doping method, the doping efficiency and the concentration of the dopant can be controlled by electrolysis. The latter can be carried out by simultaneously applying a mixture or dispersion of an organic semiconductor compound and a dopant, and then performing a dry treatment. For example, when a vacuum deposition method is employed, the dopant can be introduced by depositing the dopant and the organic semiconductor compound at the same time. When a sputtering method is employed to form the film, the dopant is introduced in the film by performing the sputtering method using two targets for the organic semiconductor compound and the dopant.

As a method for forming the organic semiconductor film, a vacuum deposition method, a molecular beam epitaxial growth method, an ion cluster beam method, a low energy ion beam method, an ion plating method, a CVD method, a sputtering method, a plasma polymerization method, an electrolysis polymerization method, a chemical polymerization method, a spray coating method, a spin coating method, a blade coating method, a deep coating method, a cast method, a roll coating method, a bar coating method, a die coating method, an inkjet method, an LB method and so on can be exemplified, one or more of them can be properly selected depending on the material employed. Among them, considering productivity, the spin coating method, the blade coating method, the deep coating method, the roll coating method, the bar coating method and the die coating method which use an organic semiconductor compound to form a thin film simply and precisely, are more desirable. The thickness of the organic semiconductor film is not especially limited. However, the characteristics of the obtained transistor tend to depend on the thickness of the organic semiconductor film and are different according to kinds of the organic semiconductors. In addition, it is desirable for the thickness to be 1 μm or less, more preferably, 10 to 300 nm.

It is necessary that the gate insulating film 103 have a high insulating property and high resistance against an insulating destruction. In order to apply a strong electric field into the organic semiconductor film 102, the gate insulating film 103 is desirable to be formed thinly. However, when it is too thin, the applied gate voltage can destroy the gate insulating film 103. As a result, a material used for the gate insulating film should be properly selected considering a dielectric constant and so on.

For the gate insulating film 103, the followings are employable but not limited thereto; a polymer thin film such as polyvinylphenol, polyparaxylene and derivatives thereof, polyimide and derivatives thereof, polyacrylonitrile, polymethacrylatemethyl, polystyrene, polyphenol derivatives, polyurea, polyethylene, polypropylene, polyvinyl chloride, polyvinylidene chloride, polyvinyl fluoride, polyvinylidene fluoride, and acetylcellulose and derivatives thereof; a metal oxide thin film made of metal such as aluminum; an inorganic oxide thin film such as a silicon oxide; an inorganic nitride thin film such as silicon nitride; or combination thereof. For the process of forming the gate insulating film 103, the followings are employable but not limited thereto: a wet method using a spin coating method; a dry method of forming an organic thin film by vacuum deposition; a method of forming a thin film using electrolysis; an electrolytic polymerization method; a method of forming a silicone oxide or an aluminum thin film by a spin coating method.

The source-side buffer layer 104 and the drain-side buffer layer 105 are provided such that the source electrode 106 and drain electrode 107 does not directly contact with the organic semiconductor film 102. In addition, they are constructed such that the current flowing into the organic semiconductor film 102 passes through the source-side buffer layer 104 and the drain-side buffer layer 105.

As materials for the source-side buffer layer 104 and the drain-side buffer layer 105, the following materials can be employed: an oxide such as Mo, Cr, W, V, Nb, Ta, Ti, Zr, Hf, Sc, Y, a rare earth element from La to Lu, Th, Mg, Fe, Ru, Os, Co, Ni, Cu, Zn, Cd, Al, Ga, In, Si, Ge, Sn, Pb, Sb, Si; a nitride thereof; a complex oxide thereof; combination thereof; a complex oxide of alkali metal or alkali earth metal therewith; and a complex nitride of alkali metal or alkali earth metal therewith.

In addition, the source-side buffer layer 104 and the drain-side buffer layer 105 can be formed with the above-mentioned materials using a typical method for forming a thin film, such as a vacuum deposition method using a resistor heating method, an electron beam deposition method, a sputtering method, a CVD method, and a PVD method.

At this time, the thickness of the layer is properly determined depending on the material employed. Generally, it is preferable that it is within a range of 1 nm to 1 μm and it is more preferable that it is within a range of 3 to 100 nm.

In addition, when the thickness of the source-side buffer layer 104 and the drain-side buffer layer 105 is too thin, it is hard to obtain a thin film with a uniform thickness. In contrast, when it is too thick, electric resistance increases, the driving voltage increase, so that the uniformity of the film becomes deteriorated.

In addition, since it is not necessary that the source-side buffer layer 104 and the drain-side buffer layer 105 have the same material and thickness, they may have a material and thickness different from each other. These can be properly determined depending on the operation hoped for the organic field effect transistor, that is, the applied voltage or power and whether the element is driven in direct-current wise or alternating-current wise.

For the source electrode 106, the drain electrode 107 and the gate electrode 108, an organic conductive film such as PEDOT and a conductive thin film such as a metal are used. For example, the followings can be employed: Au, Cu, Al, Pt, Cr, Pd, In, Ni, Mg, Ag, Ga and an alloy thereof; an oxide semiconductor such as Sn—In oxide, polysilicone, amorphous silicone, Tin (Sn) Oxide, Indium (In) oxide, and Titanium(Ti) oxide; and a chemical semiconductor such as AsGa and GaN.

In addition, when the source-side buffer layer 104 and the drain-side buffer layer 105 are formed of the above-mentioned materials, a Schottky barrier may be formed between the source electrode 106 and the source-side buffer layer 104 and between the drain electrode 107 and the drain-side buffer layer 105. The Schottky barrier causes a useless driving voltage increase and rectification when the organic field effect transistor is driven, and thus it interferes with the operation of the organic field effect transistor.

Therefore, the material for forming the source electrode 106 and the drain electrode 107 are preferably selected as materials that can minimize the Schottky barriers formed therebetween, respectively.

In addition, since the gate electrode 108 is insulated with the gate insulating film 103 and the carrier is not basically introduced from the gate electrode, there is no need for considering the Schottky barrier. However, since the difference between a work function of each of the gate electrode 108 and the organic semiconductor film 102 is reflected on a threshold voltage, it is necessary to suitably select the material of the gate electrode 108 when the threshold voltage is close to the difference between the work function.

EXAMPLE 2

Next, a second example according to the present invention will be described below. First, an aluminum (Al) thin film is formed on a substrate 101 made of glass by about 500 nm thickness under 0.27 mPa (=2×10$^{-6}$ Torr) using a resistant heat deposition apparatus and then patterned using a photolithography method to form a gate electrode 108 (FIG. 11(a)).

Next, a polyimide film is deposited thereon to form a gate insulating film 103 (FIG. 11(b)), polyphenylenevinylene is spin coated thereon and then subject to a heat treatment to form a p-type organic semiconductor film 102 containing polyphenylenevinylene as a main component (FIG. 11(c)).

Next, the sample is divided into two samples. A source-side buffer layer 104 and a drain-side buffer layer 105 are formed on one sample (hereinafter, referred to as a present sample) and not formed on the other sample (hereinafter, referred to as a comparative sample).

On the present sample, as shown in FIG. 11(d), as the source-side buffer layer 104 and the drain-side buffer layer 105, a molybdenum oxide M is formed by 20 nm thickness using a vacuum deposition method and then a metal layer M is formed using a vapor deposition method. On the other hand, on the comparative sample, the metal layer M is directly formed using a vapor deposition method without forming the molybdenum oxide layer.

On the two samples, when the metal layer M is vacuum-deposited, a source electrode 106 and a drain electrode 107 are formed using a proper mask, as shown in FIG. 10.

The organic field effect transistors in the present sample and the comparative sample obtained by the above-mentioned processes are continuously operated, so that characteristic deterioration thereof is evaluated. FIG. 12 is a graph showing the evaluation results. Here, it shows the change of a current between the source and the drain according to time when a gate voltage and a voltage between the source and the drain are fixed. A curve a indicates the current between the source and the drain of the present sample, the curve b indicates the current between the source and the drain of the comparative sample, and the current between the source and the drain is represented as a maximum value.

As apprehended from FIG. 12, on the present sample where the source-side buffer layer 104 and the drain-side buffer layer 105 are formed, the current between the source and the drain keeps stable after the its initial operation. But, on the comparative sample, it decreases as time elapses. That is, the present sample has characteristic stability while the comparative sample does not.

The reason why these advantages are obtained is not clear, but it is clear that an organic field effect transistor becomes have the stable characteristic and a long life span when at least one of the source-side buffer layer and the drain-side buffer layer is provided.

Sixth Embodiment

Next, a sixth embodiment according to the present invention will be described below. According to the first embodiment, the source-side buffer layer 104 and the drain-side buffer layer 105 have the same patterns as the source electrode 106 and the drain electrode 107, respectively. However, the second embodiment, as shown in FIG. 13, has a structure where the source-side buffer layer 104 and the drain-side buffer layer 105 are integrally formed as a buffer layer 114S formed to cover the entire surface of the organic semiconductor film 112. For the operation thereof, similar to the first embodiment, the charge injection effect can be obtained between the organic semiconductor film 112 and the source and drain electrodes 116 and 117. However, since the buffer layer 114S covers the entire surface of the organic semiconductor film 112, air is prevented from permeating into the organic semiconductor film vulnerable to moisture and heat, thus preventing the organic semiconductor film from deteriorating. Moreover, gate electrode 108, substrate 103 and insulating layer 102 are illustrated.

In addition, since the number of the manufacturing process does not increase, it can be easily manufactured. If necessary, the entire surface of the substrate with the source and drain electrodes 116 and 117 formed can be covered with a passivation film to improve its reliability much more.

Seventh Embodiment

Next, a seventh embodiment according to the present invention will be described. Unlike the first and second embodiments where the gate electrode is formed on the substrate, respectively, the third embodiment has the structure where a gate electrode 126 and a drain electrode 127 are formed on a substrate.

As shown in FIG. 14, a titanium nitride (TiN) layer serving as the source-side buffer layer 144 and the drain-side buffer layer 145 with a thickness of 1 nm is formed on the source and drain electrodes 146 and 147 having the polycide structure made of a polycrystalline silicon layer formed on the silicon substrate 141 and tungsten silicide. Then, an organic semiconductor film 142 made of PPV is formed thereon, then a gate insulating film 143 formed of a double layer of a silicon oxide film 143a and a silicon nitride film 143b is formed thereon, then a part of the silicon nitride 143b is removed, and a gate electrode 148 made of polycrystalline silicon is formed thereon. According to this structure, since the organic semiconductor film 142 is covered with the gate insulating film with the double layer structure, the organic semiconductor film is hardly oxidized and an element with superior water resistance property can be obtained.

Eighth Embodiment

Next, an eighth embodiment according to the present invention will be described. According to this embodiment, similar to the third embodiment, the source and drain electrodes 136 and 137 are formed on the substrate. However, after forming a gate insulating film 133 using a polyimide film, a gate electrode 138 is formed thereon, and a passivation film 139 made of a polyimide film is formed thereon.

As shown in FIG. 15, a molybdenum oxide (MoO$_3$) layer serving as a source-side buffer layer 134 and a drain-side buffer layer 135 with a thickness of 1 nm are formed on a source electrode 136 and a drain electrode 137 which are made of PEDOT and are formed on a flexible substrate 131 made of a polyimide film. Then, an organic semiconductor film 132 made of Alq is formed thereon, and then a gate insulating film 133 made of a silicone oxide film 133 is formed thereon. Then, a gate electrode 138 made of PEDOT is formed thereon, and then a passivation film 139 made of a polyimide film is formed thereon by a spin coating method.

According to this embodiment, since the organic semiconductor film 132 is covered with the gate insulating film 133 and the passivation film 139, it has superior water resistance, thereby preventing oxidation from generating.

According to the structure, an organic field effect transistor with stable characteristics and a long life span can be obtained.

Since an organic field effect transistor according to the present invention has stable characteristics and a long life span, it is applicable for a switching element of a liquid crystal display device and an organic EL display device or a flexible display device, or for a next generation electronic device.

This application is based upon and claims the benefits of priority of Japanese Patent Application No. 2004-142320 filed on Apr. 12, 2005 and Japanese Patent Application No. 2004-142353 filed on Apr. 12, 2005 the contents of which are incorporated herein by references in its entirety.

What is claimed is:

1. An organic field effect transistor comprising:
a substrate;
an organic semiconductor layer;
a gate electrode between said substrate and said organic semiconductor layer;
a gate insulating layer at least partially between said organic semiconductor layer and said gate electrode
a source electrode;
a first buffer layer between said source electrode and said organic semiconductor layer;
a drain electrode; and
a second buffer layer between said drain electrode and said organic semiconductor layer,
wherein at least one of said first buffer layer and said second buffer layer contains a first transition metal oxide and a second transition metal oxide, each of said first transition metal oxide and said second transition metal oxide containing a same transition metal with the transition metal having a different valence in each of said first transition metal oxide and said second transition metal oxide.

2. The organic field effect transistor according to claim 1, wherein at least one of said first charge injection layer and said second charge injection layer has higher energy level compared with said organic semiconductor layer.

3. The organic field effect transistor according to claim 2, wherein said first metal oxide is $MoO_3$ and said second metal oxide is $MoO_2$.

4. An organic field effect transistor comprising:
a substrate;
an organic semiconductor layer;
a gate electrode between said substrate and said organic semiconductor layer;
a gate insulating layer at least partially between said organic semiconductor layer and said gate electrode;
a source electrode;
a first charge injection layer between said source electrode and said organic semiconductor layer;
a drain electrode; and
a second charge injection layer between said drain electrode and said organic semiconductor layer,
wherein at least one of said first charge injection layer and said second charge injection layer contains a first transition metal oxide and a second transition metal oxide, each of said first transition metal oxide and said second transition metal oxide containing a same transition metal with the transition metal having a different valence in each of said first transition metal oxide and said second transition metal oxide.

5. The organic field effect transistor according to claim 4 further comprising:
said first charge injection layer and said second charge injection layer comprise an integral layer.

6. The organic field effect transistor according to claim 5, wherein the integral layer covers an entire surface of said organic semiconductor layer.

7. The organic field effect transistor according to claim 4, wherein at least one of said first charge injection layer and said second charge injection layer is made of a molybdenum oxide.

8. The organic field effect transistor according to claim 4, wherein at least one of said first charge injection layer and said second charge injection layer is made of a vanadium oxide.

9. The organic field effect transistor according to claim 4, wherein said organic semiconductor layer comprises a high molecular weight material.

10. The organic field effect transistor according to claim 4, wherein at least one of said first charge injection layer and said second charge injection layer has higher energy level compared with said organic semiconductor layer.

11. The organic field effect transistor according to claim 10, wherein said first metal oxide is $MoO_3$ and said second metal oxide is $MoO_2$.

12. An organic field effect transistor comprising:
a substrate;
an organic semiconductor layer including a first side and a second side opposite to the first side;
a gate electrode between said substrate and the second side of said organic semiconductor layer;
a gate insulating layer at least partially between said organic semiconductor layer and said gate electrode;
a source electrode provided on the first side of said organic semiconductor layer,
a drain electrode provided on the first side of said organic semiconductor layer;
a first charge injection layer between said organic semiconductor layer and said source electrode; and
a second charge injection layer between said organic semiconductor layer and said drain electrode,
wherein at least one of said first charge injection layer and said second charge injection layer contains a first transition metal oxide and a second transition metal oxide, each of said first transition metal oxide and said second transition metal oxide containing a same transition metal with the transition metal having a different valence in each of said first transition metal oxide and said second transition metal oxide.

13. The organic field effect transistor according to claim 12 further comprising:
said first charge injection layer and said second charge injection layer comprise an integral layer.

14. The organic field effect transistor according to claim 13, wherein the integral layer covers an entire surface of said organic semiconductor layer.

15. The organic field effect transistor according to claim 12, wherein at least one of said first charge injection layer and said second charge injection layer is made of a molybdenum oxide.

16. The organic field effect transistor according to claim 12, wherein at least one of said first charge injection layer and said second charge injection layer is made of a vanadium oxide.

17. The organic field effect transistor according to claim 12, wherein said organic semiconductor layer comprises a high molecular weight material.

18. The organic field effect transistor according to claim 12, wherein at least one of said first charge injection layer and said second charge injection layer has higher energy level compared with said organic semiconductor layer.

19. The organic field effect transistor according to claim 18, wherein said first metal oxide is $MoO_3$ and said second metal oxide is $MoO_2$.

20. An organic field effect transistor comprising:
a substrate;
an organic semiconductor layer including a first side and a second side opposite to the first side;
a gate electrode between said substrate and the second side of said organic semiconductor layer;
a gate insulating layer at least partially between said organic semiconductor layer and said gate electrode;
a source electrode provided on the first side of said organic semiconductor layer,
a drain electrode provided on the first side of said organic semiconductor layer;
a first buffer layer between said organic semiconductor layer and said source electrode; and
a second buffer layer between said organic semiconductor layer and said drain electrode,
wherein at least one of said first buffer layer and said second buffer layer contains a first transition metal oxide and a second transition metal oxide, each of said first transition metal oxide and said second transition metal oxide containing a same transition metal with the transition metal having a different valence in each of said first transition metal oxide and said second transition metal oxide.

21. The organic field effect transistor according to claim 20, wherein at least one of said first buffer layer and said second buffer layer has higher energy level compared with said organic semiconductor layer.

22. The organic field effect transistor according to claim 21, wherein said first metal oxide is $MoO_3$ and said second metal oxide is $MoO_2$.

23. An organic field effect transistor comprising:
a substrate;
an organic semiconductor layer;
a gate electrode;
a gate insulating layer at least partially between said organic semiconductor layer and said gate electrode, said gate insulating layer having a first area and a second area, said first area being between said gate electrode and said organic semiconductor layer, said first area being thinner than said second area, and said organic semiconductor layer being between said substrate and said gate insulating layer;
a source electrode between said gate insulating layer and said substrate, said source electrode being between at least a portion of said organic semiconductor layer and said substrate;
a drain electrode between said gate insulating layer and said substrate, said source electrode between at least a portion of said organic semiconductor layer and said substrate,
a first charge injection layer between said organic semiconductor layer and said source electrode; and
a second charge injection layer between said organic semiconductor layer and said drain electrode,
wherein at least one of said first charge injection layer and said second charge injection layer contains a first transition metal oxide and a second transition metal oxide, each of said first transition metal oxide and said second transition metal oxide containing a same transition metal with the transition metal having a different valence in each of said first transition metal oxide and said second transition metal oxide.

24. The organic field effect transistor according to claim 23, wherein said first area comprises a first sub-layer and said second area comprises said first sub-layer and a second sub-layer.

25. The organic field effect transistor according to claim 24, wherein said first sub-layer is made of silicon oxide and said second sub-layer is made of silicon nitride.

26. The organic field effect transistor according to claim 23, wherein at least one of said first charge injection layer and said second charge injection layer is made of a molybdenum oxide.

27. The organic field effect transistor according to claim 23, wherein at least one of said first charge injection layer and said second charge injection layer is made of a vanadium oxide.

28. The organic field effect transistor according to claim 23, wherein said organic semiconductor layer comprises a high molecular weight material.

29. The organic field effect transistor according to claim 23, wherein at least one of said first charge injection layer and said second charge injection layer has higher energy level compared with said organic semiconductor layer.

30. The organic field effect transistor according to claim 29, wherein said first metal oxide is $MoO_3$ and said second metal oxide is $MoO_2$.

* * * * *